(12) United States Patent
Roy

(10) Patent No.: US 11,048,105 B1
(45) Date of Patent: Jun. 29, 2021

(54) VISOR-LIKE TABLET AND TABLET HOLDER FOR AUTOMOTIVE VEHICLE

(71) Applicant: Matthew Roy, Ottawa (CA)

(72) Inventor: Matthew Roy, Ottawa (CA)

( * ) Notice: Subject to any disclaimer, the term of this patent is extended or adjusted under 35 U.S.C. 154(b) by 0 days.

(21) Appl. No.: 16/144,987

(22) Filed: Sep. 27, 2018

Related U.S. Application Data

(60) Provisional application No. 62/566,387, filed on Sep. 30, 2017.

(51) Int. Cl.

| | | |
|---|---|---|
| *G02F 1/01* | (2006.01) | |
| *B60J 3/00* | (2006.01) | |
| *G06F 3/01* | (2006.01) | |
| *G09G 3/3208* | (2016.01) | |
| *G06F 1/16* | (2006.01) | |
| *B60R 11/02* | (2006.01) | |
| *G06F 3/041* | (2006.01) | |
| *B60R 11/00* | (2006.01) | |
| *H04N 5/33* | (2006.01) | |
| *G06T 19/00* | (2011.01) | |

(52) U.S. Cl.
CPC ........ *G02F 1/0121* (2013.01); *B60R 11/0252* (2013.01); *G02F 1/0126* (2013.01); *G06F 1/1632* (2013.01); *G06F 3/013* (2013.01); *G06F 3/041* (2013.01); *G09G 3/3208* (2013.01); *B60R 2011/0028* (2013.01); *B60R 2011/0084* (2013.01); *B60R 2011/0085* (2013.01); *G02F 2203/48* (2013.01); *G06T 19/006* (2013.01); *G06T 2210/62* (2013.01); *G09G 2354/00* (2013.01); *G09G 2360/144* (2013.01); *G09G 2380/10* (2013.01); *H04N 5/33* (2013.01)

(58) Field of Classification Search
CPC .. G02F 1/0121; G02F 1/0126; G02F 2203/48; G06F 3/041; G06F 3/013; G06F 1/1632; G09G 2360/144; G09G 3/3208; G09G 2354/00; G09G 2380/10; B60R 2011/0085; B60R 11/0252; B60R 2011/0084; B60R 2011/0028; H04N 5/33; G06T 19/006; G06T 2210/62
See application file for complete search history.

(56) References Cited

U.S. PATENT DOCUMENTS

| | | | | |
|---|---|---|---|---|
| 5,031,952 | A * | 7/1991 | Miyamoto | B60J 3/0204 |
| | | | | 296/97.4 |
| D650,783 | S * | 12/2011 | Ausfeld | D14/434 |
| 8,550,531 | B1 * | 10/2013 | Fancher, III | B60J 3/0208 |
| | | | | 296/97.8 |
| 9,066,421 | B1 * | 6/2015 | Martin | H05K 5/0217 |
| 9,470,356 | B1 * | 10/2016 | Zaloom | A47B 23/04 |
| 10,017,125 | B2 * | 7/2018 | Frazier | B60R 11/0252 |
| 10,160,295 | B1 * | 12/2018 | Lopez Gonzalez | B60J 3/0208 |
| 10,336,263 | B2 * | 7/2019 | Ligi, Jr. | B60R 16/037 |
| 10,355,731 | B1 * | 7/2019 | Miller | H04B 1/3877 |
| 2002/0017799 | A1 * | 2/2002 | Asai | B60J 3/023 |
| | | | | 296/97.9 |

(Continued)

*Primary Examiner* — Ibrahim A Khan

(57) ABSTRACT

An automotive vehicle comprising a cabin having a windshield, a tablet holder pivotally connected to an interior surface of the cabin, the tablet holder being pivotable between a stowed position and a deployed position, and a tablet detachably mounted to the tablet holder. In one embodiment, the tablet is a transparent tablet that may be configured to dynamically shade its display screen to attenuate incoming light.

19 Claims, 30 Drawing Sheets

(56) References Cited

U.S. PATENT DOCUMENTS

| | | | | |
|---|---|---|---|---|
| 2004/0011835 A1* | 1/2004 | Kim | B60J 3/0204 | 224/312 |
| 2008/0164715 A1* | 7/2008 | Selvini | B60J 3/0226 | 296/97.13 |
| 2009/0079224 A1* | 3/2009 | Osborne | B64D 45/00 | 296/97.11 |
| 2009/0250964 A1* | 10/2009 | Demma | B60J 3/02 | 296/97.2 |
| 2011/0266825 A1* | 11/2011 | Bagioli | B60J 3/0208 | 296/97.6 |
| 2012/0140125 A1* | 6/2012 | Pepitone | G02B 27/0149 | 348/794 |
| 2012/0302288 A1* | 11/2012 | Born | H04B 1/3883 | 455/557 |
| 2013/0049806 A1* | 2/2013 | Koyama | H03K 19/09441 | 326/68 |
| 2013/0050164 A1* | 2/2013 | Rericha | G06F 3/1423 | 345/205 |
| 2013/0076663 A1* | 3/2013 | Sirpal | G09G 5/373 | 345/173 |
| 2013/0092805 A1* | 4/2013 | Funk | F16M 13/00 | 248/121 |
| 2013/0092811 A1* | 4/2013 | Funk | H05K 5/0204 | 248/371 |
| 2013/0147936 A1* | 6/2013 | Lee | G06K 9/00845 | 348/78 |
| 2013/0188821 A1* | 7/2013 | Schul | H04R 5/02 | 381/394 |
| 2013/0193174 A1* | 8/2013 | Ackeret | B60R 7/04 | 224/275 |
| 2014/0239665 A1* | 8/2014 | Goodwin | B60J 3/0208 | 296/97.6 |
| 2015/0009672 A1* | 1/2015 | Girault | A45F 5/00 | 362/253 |
| 2015/0010188 A1* | 1/2015 | Mei | H04R 5/02 | 381/333 |
| 2015/0028075 A1* | 1/2015 | Khatchatrian | B60R 11/0258 | 224/483 |
| 2015/0360618 A1* | 12/2015 | Richard | B60R 11/0235 | 348/148 |
| 2016/0114731 A1* | 4/2016 | Habibi | B60J 3/04 | 345/173 |
| 2016/0253971 A1* | 9/2016 | Shepard | G06K 9/00228 | 345/667 |
| 2017/0218678 A1* | 8/2017 | Kothari | B60Q 1/323 | |
| 2017/0237843 A1* | 8/2017 | Ackeret | H04B 1/3888 | 455/575.9 |
| 2017/0302322 A1* | 10/2017 | Harris | F16M 13/00 | |
| 2017/0309215 A1* | 10/2017 | Perdices-Gonzalez | G09G 3/2003 | |
| 2017/0313248 A1* | 11/2017 | Kothari | H04N 5/247 | |
| 2018/0088323 A1* | 3/2018 | Bao | G02B 27/0093 | |

\* cited by examiner

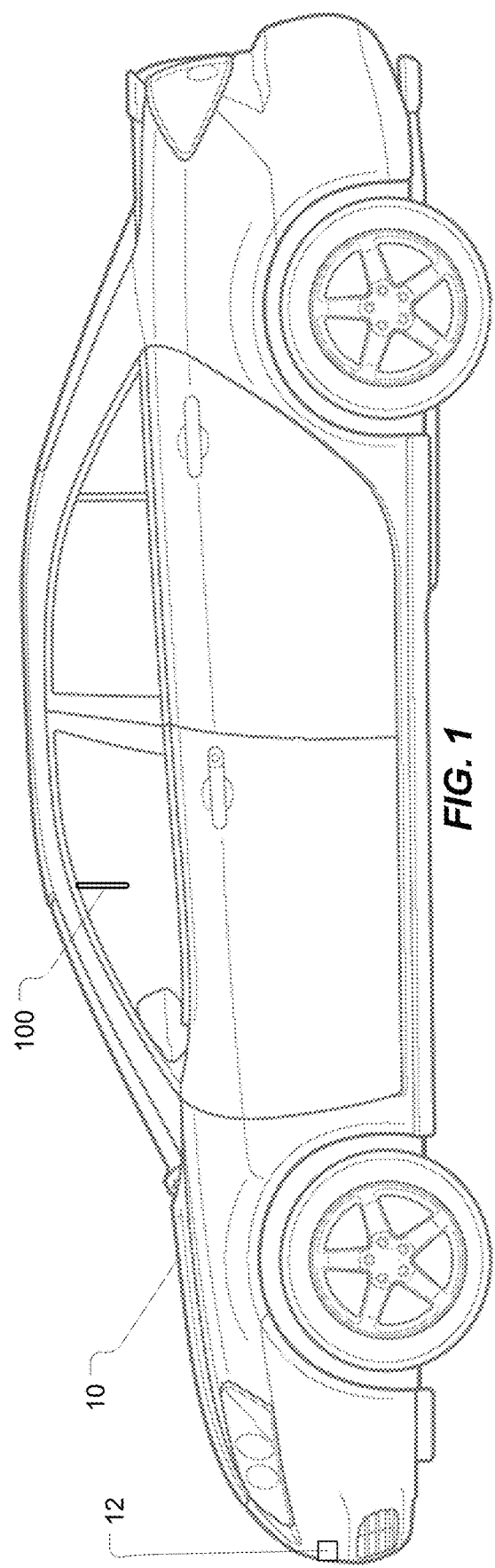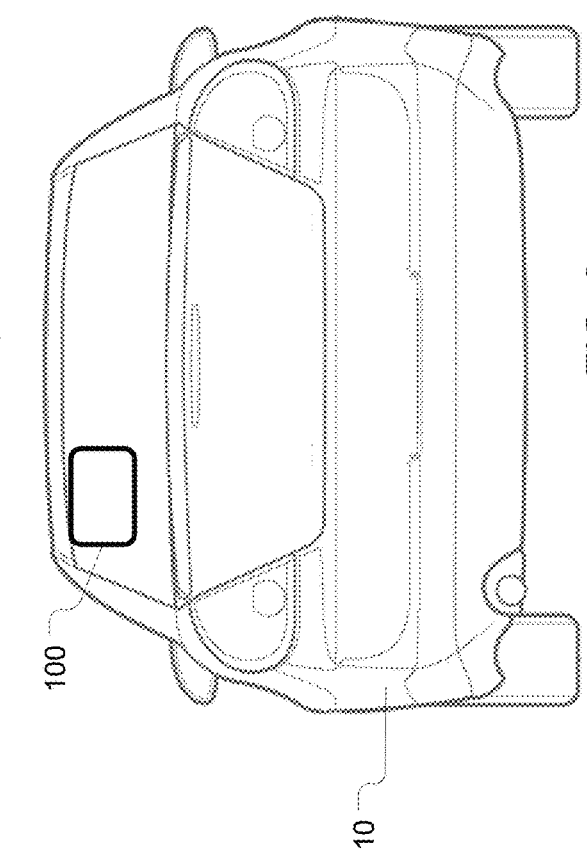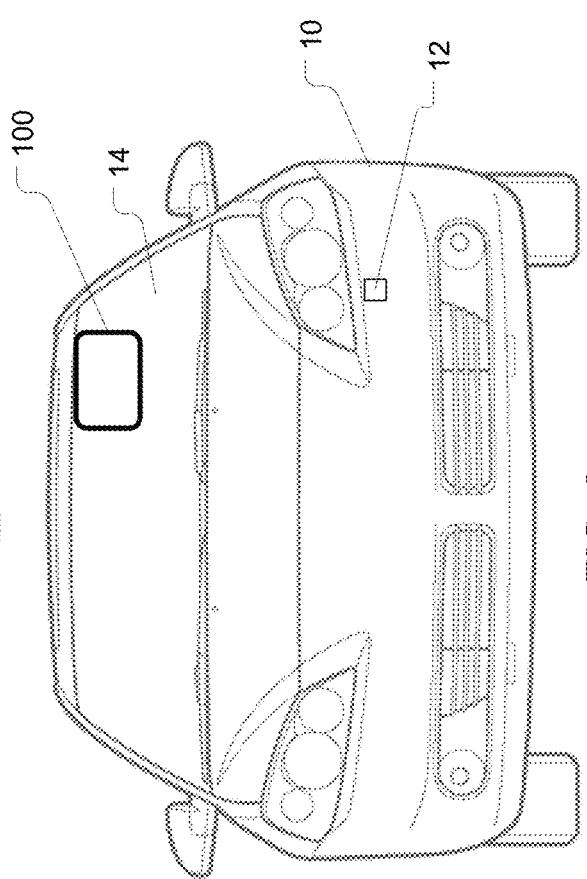

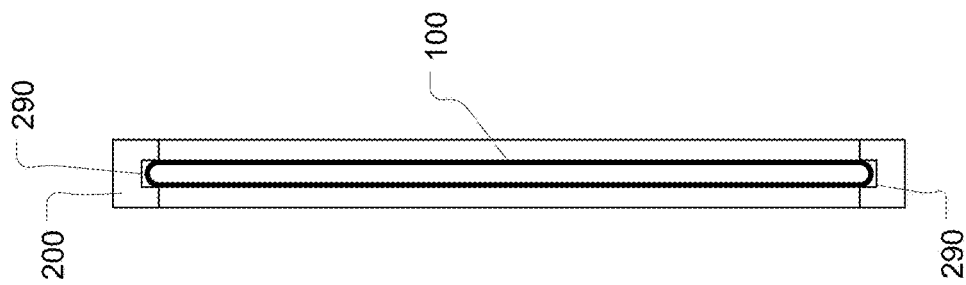
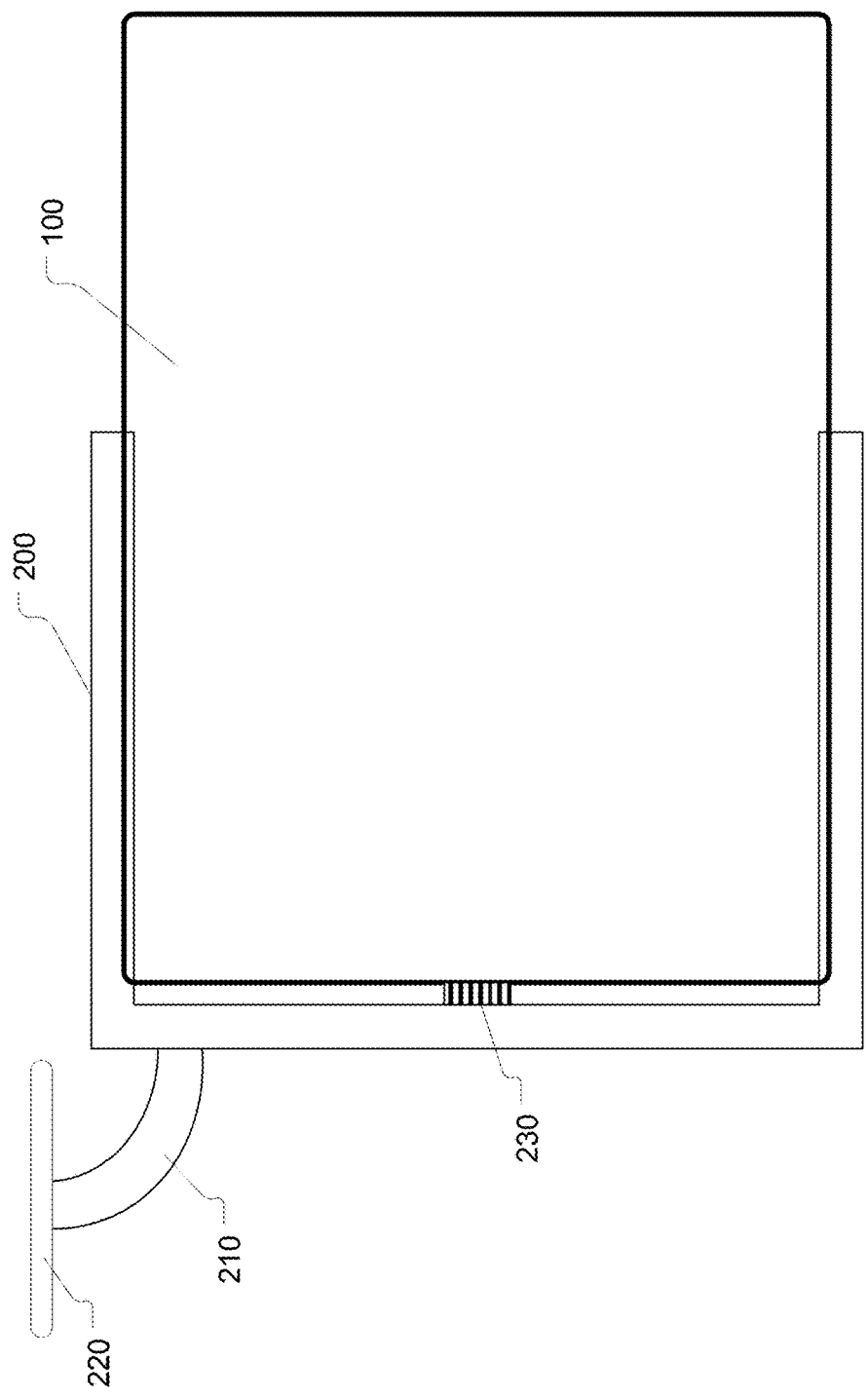
FIG. 20
FIG. 19

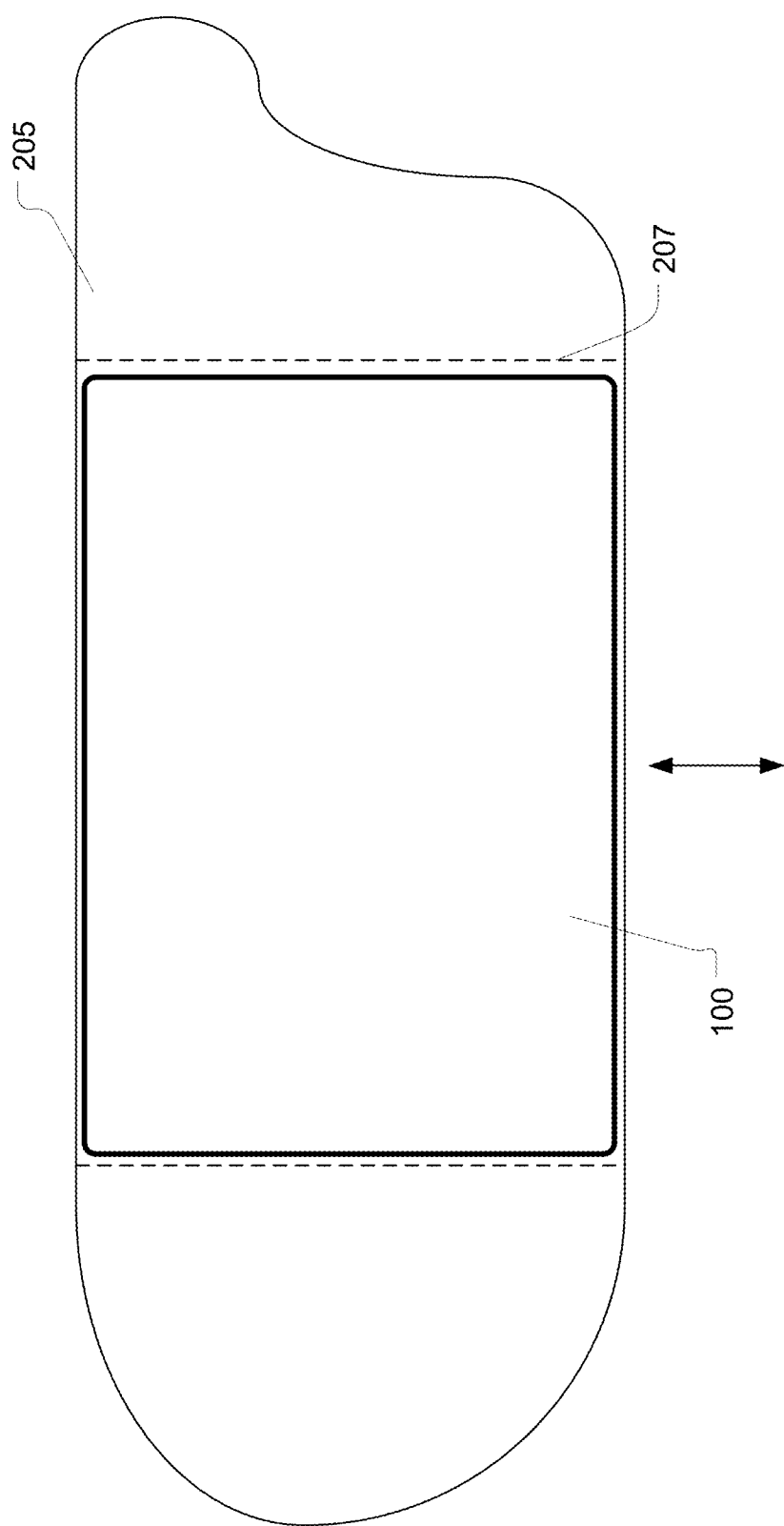

US 11,048,105 B1

VISOR-LIKE TABLET AND TABLET HOLDER FOR AUTOMOTIVE VEHICLE

CROSS-REFERENCE TO RELATED APPLICATIONS

This application claims priority to U.S. 62/566,387 filed Sep. 30, 2017.

TECHNICAL FIELD

The present invention relates generally to automobiles and, in particular, to a tablet holder for holding a tablet inside an automobile.

BACKGROUND

Most automotive vehicles or automobiles (i.e. cars, vans, buses or trucks) typically have a visor that can be pivoted from a stowed position to a deployed position for the purposes of blocking visibility-impairing sunlight. Most vehicles have a driver-side visor and a passenger-side visor. The driver or passenger deploys the visor to block the sun. However, it is known that the visor should not be positioned to completely block the driver's view when the driver is operating the vehicle. Improved visor designs have transparent glass or plastic to attenuate the sunlight. It is also known in the automotive industry to equip the visor with a vanity mirror and one or more lights. It is also known to provide pouches on the visor for holding various personal items. More recently, it is become to known to provide the passenger-side visor with a DVD player with a small LCD screen to enable the passenger to watch a movie or other video content.

U.S. Patent Application Publication 2009/0122139 discloses a truck with a camera image displayed on a sun visor.

U.S. Patent Application Publication 2012/0140125 discloses an aircraft cockpit visor made of an OLED material.

A smart vehicle sun visor is disclosed by U.S. Pat. No. 9,712,741 in which camera images are displayed on the visor.

Innovations and improvements relating to this aspect of automotive vehicles are highly desirable.

SUMMARY

In general, the present invention provides a tablet holder for detachably mounting a tablet in the place of a visor inside an automobile. The tablet, in one embodiment, is made of a transparent organic light emitting diode (OLED), herein designated a "transparent tablet", through which the driver may see. The transparent tablet may be configured via its processor to dynamically adjust the shading of the display, on all or part of the display screen, to attenuate or reduce intense sunlight, glare or the bright headlights of oncoming vehicles at night or in low-light conditions.

Thus, an inventive aspect of the present disclosure is an automotive vehicle comprising a cabin having a windshield, a tablet holder pivotally connected to an interior surface of the cabin, the tablet holder being pivotable between a stowed position and a deployed position and a tablet detachably mounted to the tablet holder.

Another inventive aspect of the present disclosure is a tablet holder for automotive vehicle. The tablet holder has a support bracket defining a docking station to detachably hold a tablet inside a cabin of the automotive vehicle, a pivot to rotate the support bracket and the tablet between a stowed position and a deployed position and a combined power and data port for connecting to a combined power and data socket of the tablet to both supply power from the automotive vehicle to recharge a battery of the tablet and also to communicate data from the automotive vehicle to the tablet.

Yet another inventive aspect of the present disclosure is a tablet for being detachably held inside a cabin of an automotive vehicle. The tablet has a combined power and data socket to receive power and data from a combined power and data port on a holder pivotally mounted inside the cabin of the automotive vehicle, a processor and a transparent display screen.

The foregoing presents a simplified summary of the invention in order to provide a basic understanding of some aspects of the invention. This summary is not an exhaustive overview of the invention. It is not intended to identify essential, key or critical elements of the invention or to delineate the scope of the invention. Its sole purpose is to present some concepts in a simplified form as a prelude to the more detailed description that is discussed later. Other aspects of the invention are described below in relation to the accompanying drawings.

BRIEF DESCRIPTION OF THE DRAWINGS

Further features and advantages of the present technology will become apparent from the following detailed description, taken in combination with the appended drawings, in which:

FIG. 1 is a side view of a vehicle having a detachable visor-like tablet in accordance with an embodiment of the present invention;

FIG. 2 is a front view of the vehicle of FIG. 1;

FIG. 3 is a rear view of the vehicle of FIG. 1;

FIG. 19 depicts a tablet holder having grooves for holding the tablet in accordance with another embodiment;

FIG. 20 is an end view of the tablet holder and tablet of FIG. 19;

FIG. 21 depicts a contoured sun visor having a receptacle for holding a tablet in accordance with another embodiment of the invention;

It will be noted that throughout the appended drawings, like features are identified by like reference numerals.

DETAILED DESCRIPTION

Figure 4:
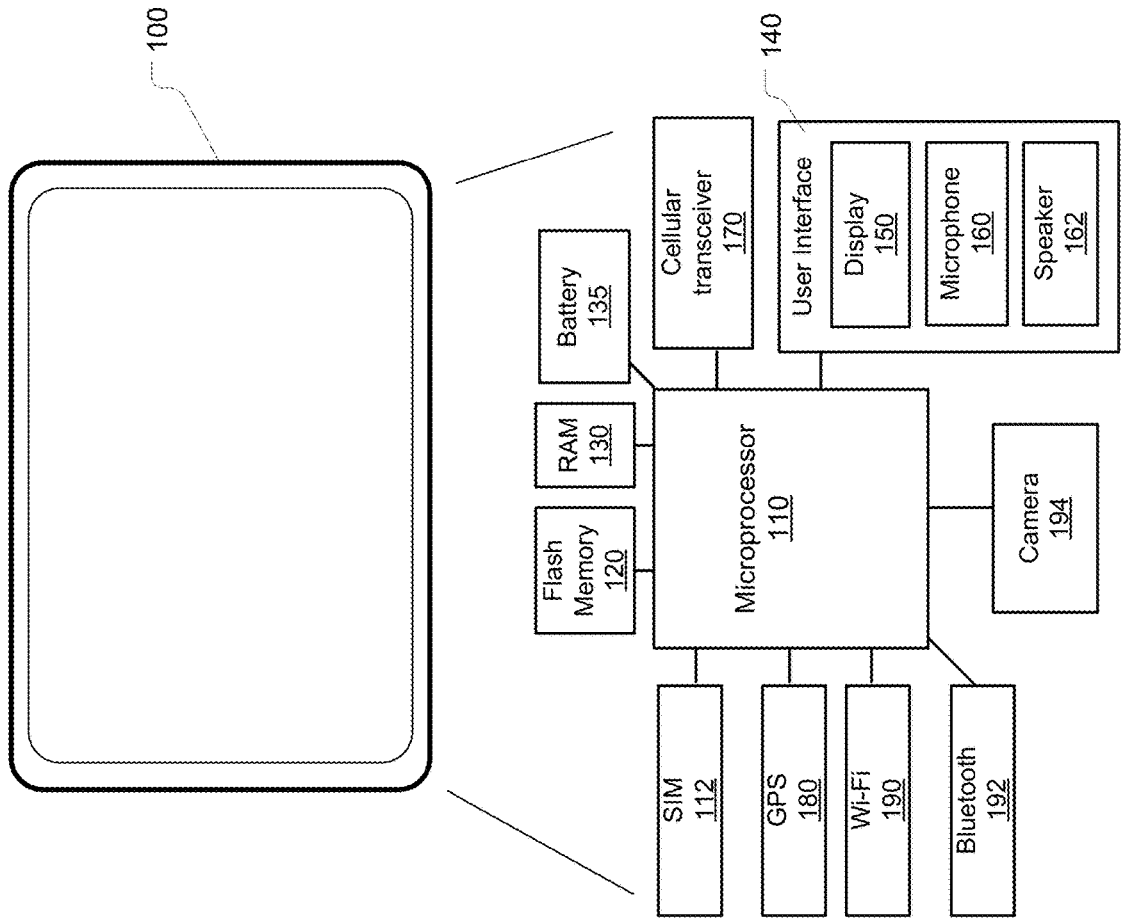
FIG. 4 is a schematic depiction of a tablet and its key functional components and subsystems.

One aspect of the present disclosure is a computing tablet holder for detachably or removably holding a computing tablet in a vehicle such as an automobile. The computing tablet (hereinafter simply the "tablet") may be docked in the holder (thus acting as a docking station for the tablet) to receive power for recharging the tablet and to receive data from, or to transmit data to, a data-processing system or computing system of the vehicle via a physical connection, plug or port although data exchange may also or alternatively be wireless. The tablet may be detached from the holder for regular handheld use of the tablet by the driver when the driver is not operating the vehicle, or in the case of an autonomous or self-driving vehicle, or by a passenger in the vehicle. The tablet holder holds the tablet in the place of a sun visor, that is, pivotally mounted by at least one pivot point to a forward interior portion of the roof above the top of the front windshield. The tablet thus replaces the conventional sun visor. The tablet may thus pivot, as would a traditional sun visor, between an upper, stowed position and a lower, deployed position. In the stowed position, the tablet is out of the line of vision of the driver or passenger, i.e. it is generally adjacent to the interior ceiling of the cabin. In the deployed position, the tablet is in the line of vision of the driver or passenger, i.e. it is adjacent the windshield.

For the purposes of this specification, the terms "automobile" or "automotive vehicle" are meant to encompass any land-based vehicle such as a car, van, minivan, sports utility vehicle (SUV), crossover-type vehicle, bus, minibus, truck, tractor-trailer or any other vehicle that may be equipped with a visor including rail vehicles. The term "automobile" or "automotive vehicle" are meant to also include any self-driving, autonomous or semi-autonomous vehicles.

The tablet holder may hold either a conventional non-transparent tablet, as are currently commercially available, such as an Apple iPad, Samsung Galaxy, Microsoft Surface Pro, Amazon Fire, etc., or a transparent tablet having a transparent OLED display, or equivalent transparent technology, as will be explained in greater detail below. In the illustrated embodiments, the tablet is held in a landscape orientation as this mimics the general shape of a sun visor but it will be appreciated that the tablet may be held alternatively in a portrait orientation in other embodiments.

FIGS. 1-3 depict an automobile designated by reference numeral 10 having a vehicle-mounted sensor such as a camera, RADAR, LIDAR, etc. The vehicle includes a tablet 100 mounted in a tablet-holder. In the embodiment depicted by way of example in FIGS. 1-3, the tablet 100 is mounted on the driver side and is shown in the deployed (down) position in which it is operative as a visor.

As depicted by way of example in FIG. 4, in accordance with some embodiments, the tablet 100 is a computing tablet that has a microprocessor (or simply "processor") 110 operatively coupled to a memory, e.g. flash memory 120 and RAM 130. The tablet includes a rechargeable battery 135. The tablet 100 may include a SIM card 112. The tablet 100 includes a user interface 140 which may include a touch-sensitive LCD or LED (or OLED) display screen 150. The tablet 100 may include a microphone 160 and a speaker 162. The tablet 100 may include one or more wireless data transceivers for wireless data communication such as a cellular transceiver 170, a Wi-Fi transceiver 190, and a Bluetooth transceiver 192. The tablet 100 may include a Global Navigation Satellite System (GNSS) receiver, e.g. a Global Positioning System (GPS) receiver 180. The tablet 100 may include one or more cameras 194, e.g. a forward-facing camera and a rearward-facing camera.

Figure 5:
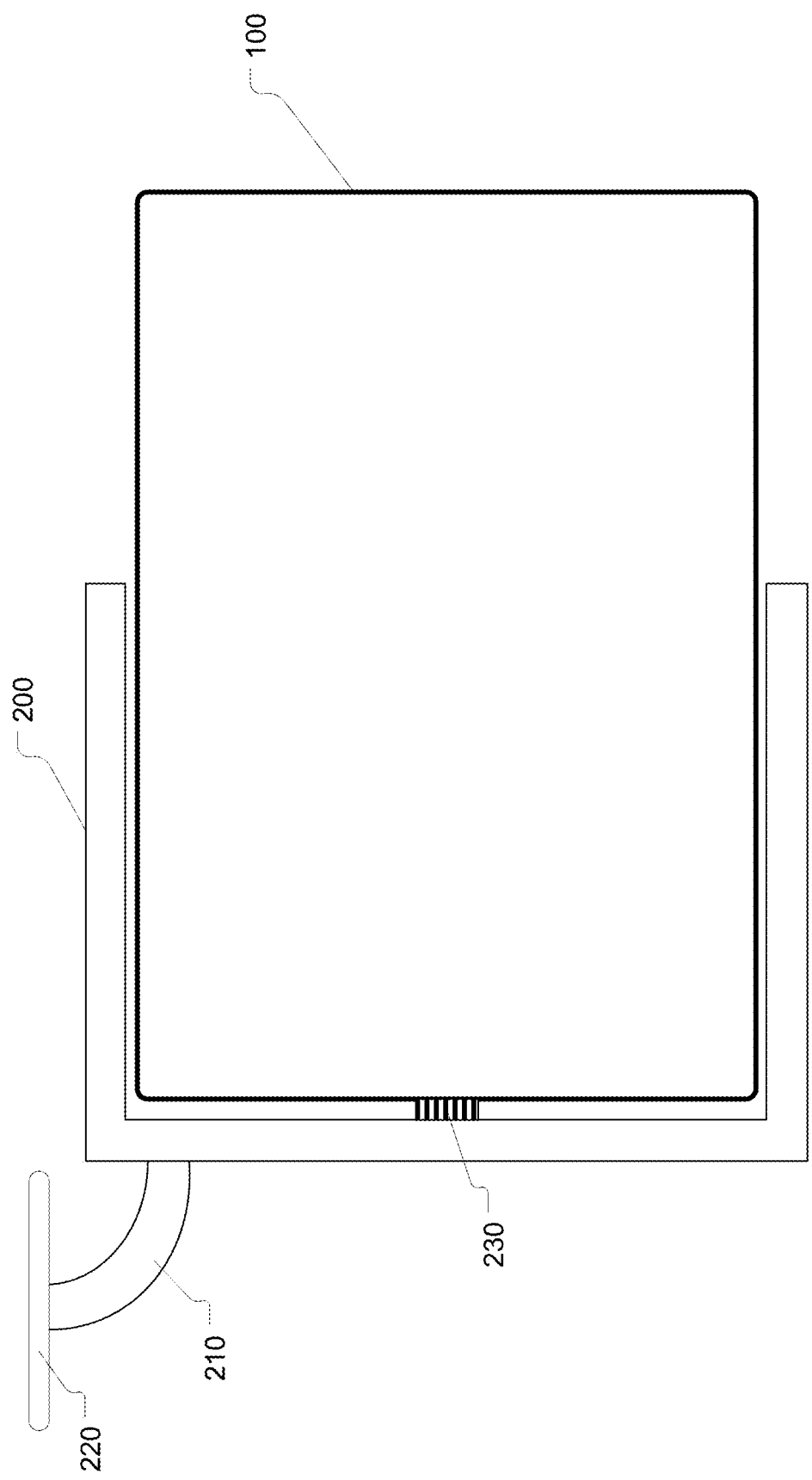
FIG. 5 depicts a tablet holder and a tablet in accordance with an embodiment of the present invention.

FIG. 5 depicts a tablet holder 200 for holding a tablet 100 in accordance with one embodiment of the invention. The tablet holder 200 has a frame-like support bracket (or mounting bracket) that functions as a docking station to receive and detachably hold the tablet 100. The holder 200 has a curved pivot arm 210 acting as a pivot. The curved pivot arm 210 leads to a flange-like ceiling mount 220 that is attached to a ceiling of the car above the driver's head or passenger's head, as the case may be. A combined power and data port 230 connects to a socket on the tablet to recharge the battery of the tablet and to communicate data to and from the tablet. The bracket in this embodiment is formed of first and second spaced apart and parallel horizontal members and an orthogonal member connecting the horizontal members, i.e. orthogonal to the horizontal members. The horizontal members are parallel to an axis of rotation of the pivot. The orthogonal member rotates in a plane perpendicular to the axis of rotation of the pivot.

Figure 6:
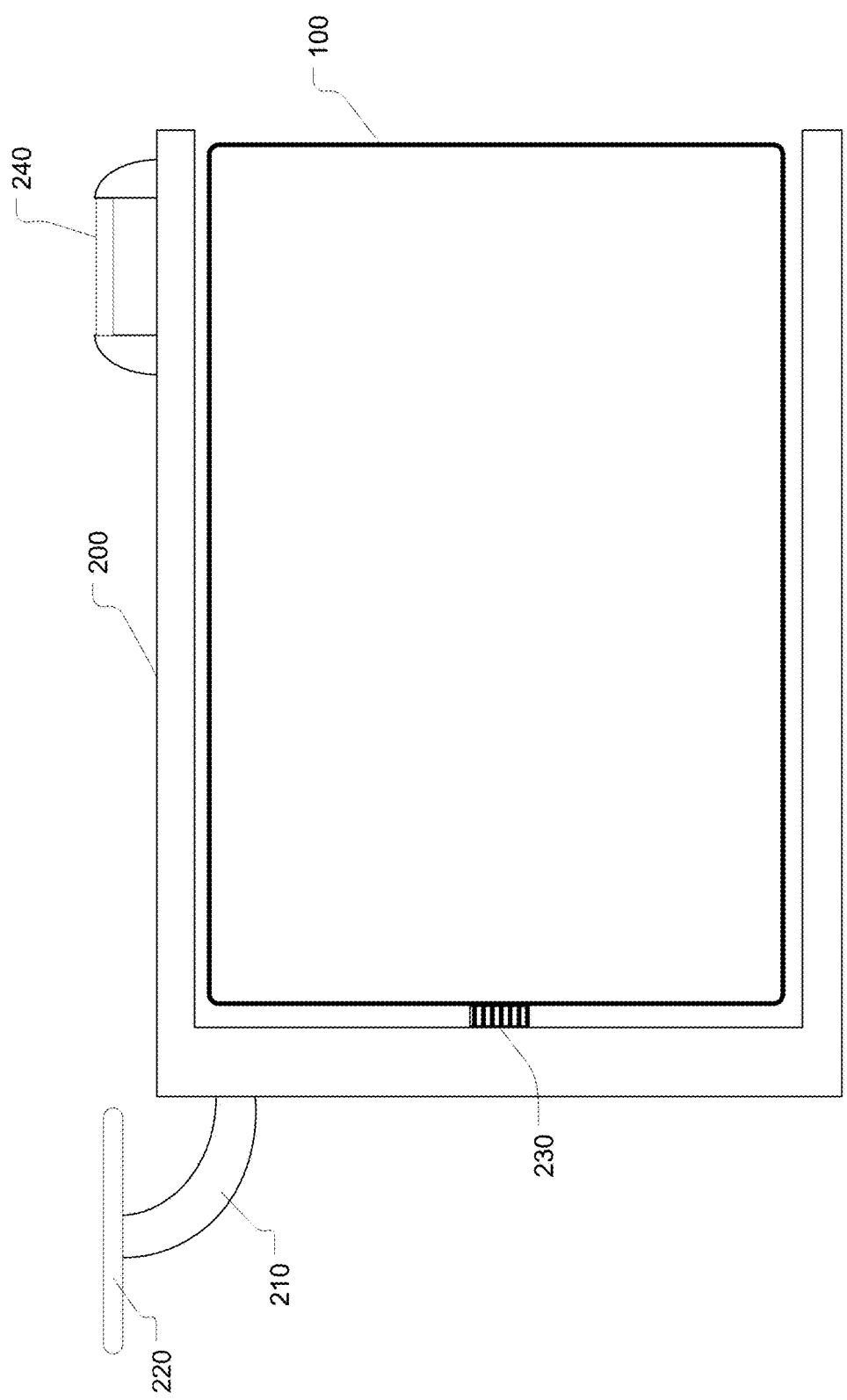
FIG. 6 depicts a tablet holder and a tablet in accordance with another embodiment of the present invention.

FIG. 6 depicts another embodiment in which there is a second attachment point for the holder in the form of a clip-like attachment 240 to attach to the ceiling at a second point spaced apart from the pivot.

Figure 7:
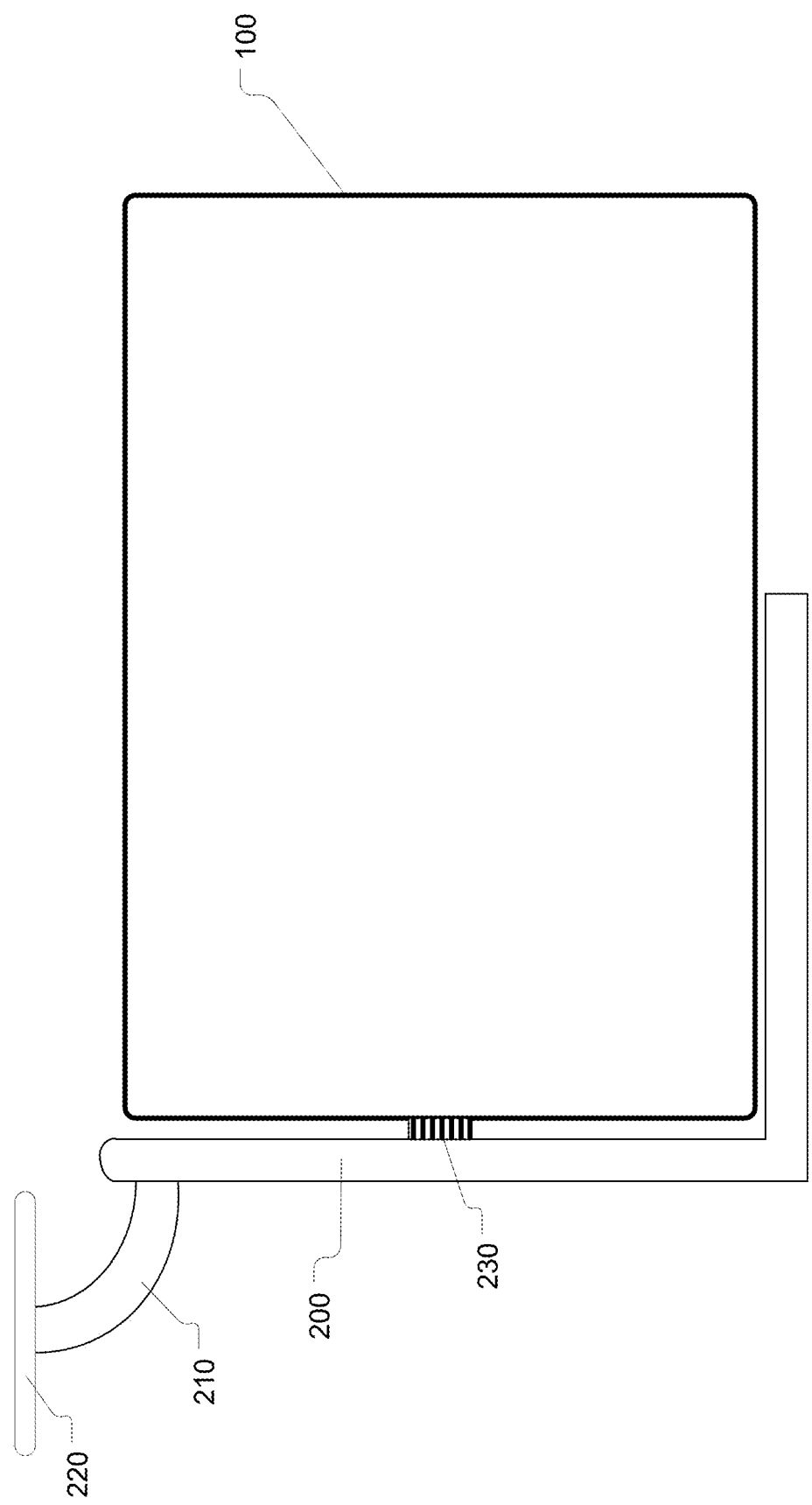
FIG. 7 depicts a tablet holder and a tablet in accordance with another embodiment of the present invention.

FIG. 7 depicts an L-shaped holder instead of the C-shaped (or sideways U-shaped) bracket in the preceding embodiments. It will be appreciated that other shapes of bracket may be used. The bracket has a horizontal member and an orthogonal member as shown. The lengths and sizes of the members may be varied as will be appreciated.

Figure 8:
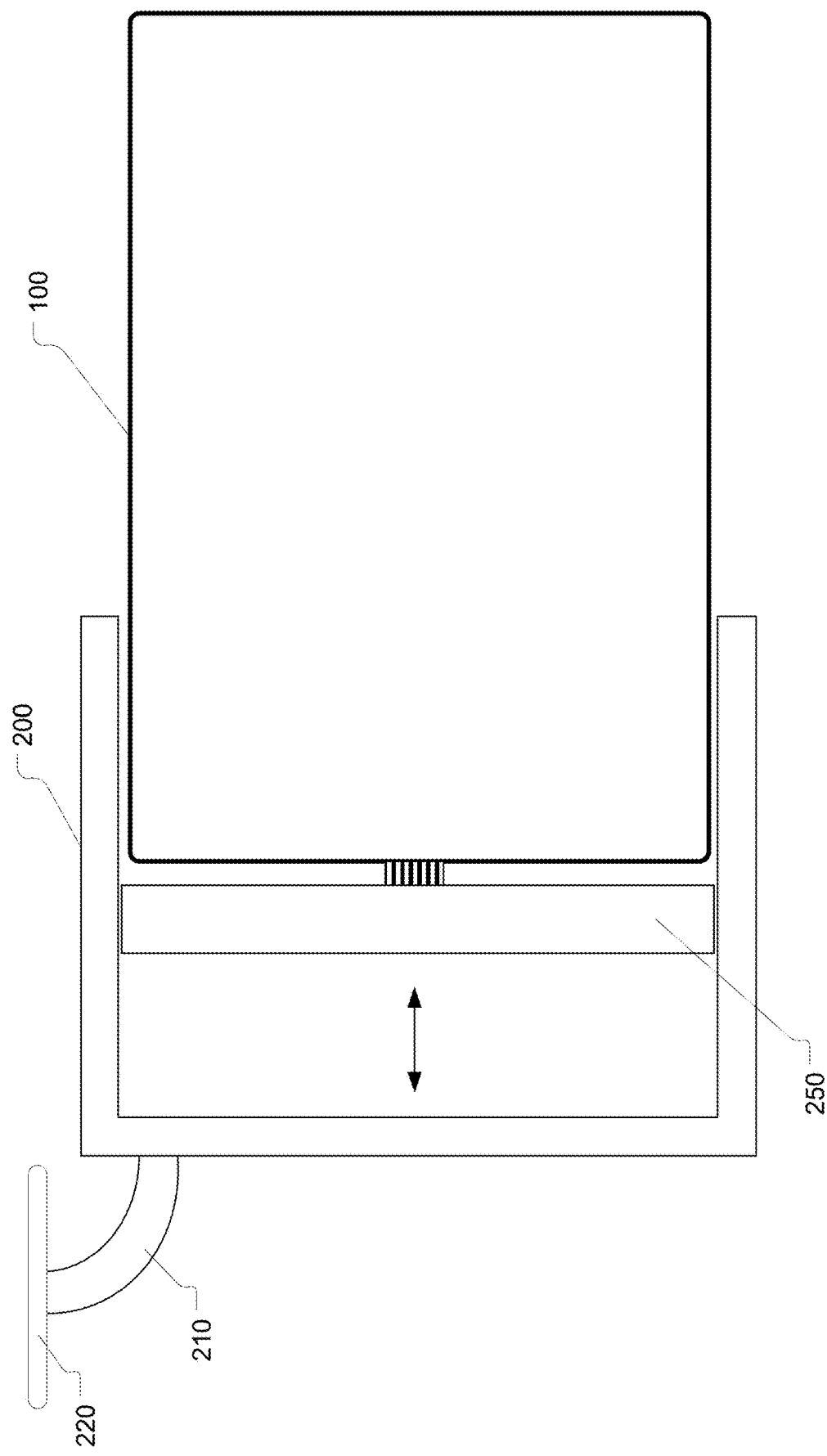
FIG. 8 depicts a tablet holder and a tablet in accordance with another embodiment of the present invention.

FIG. 8 depicts a holder with a horizontally translating mechanism 250 to horizontally translate the tablet relative to the holder. This mechanism enables the tablet to be relocated relative to the user.

Figure 9:
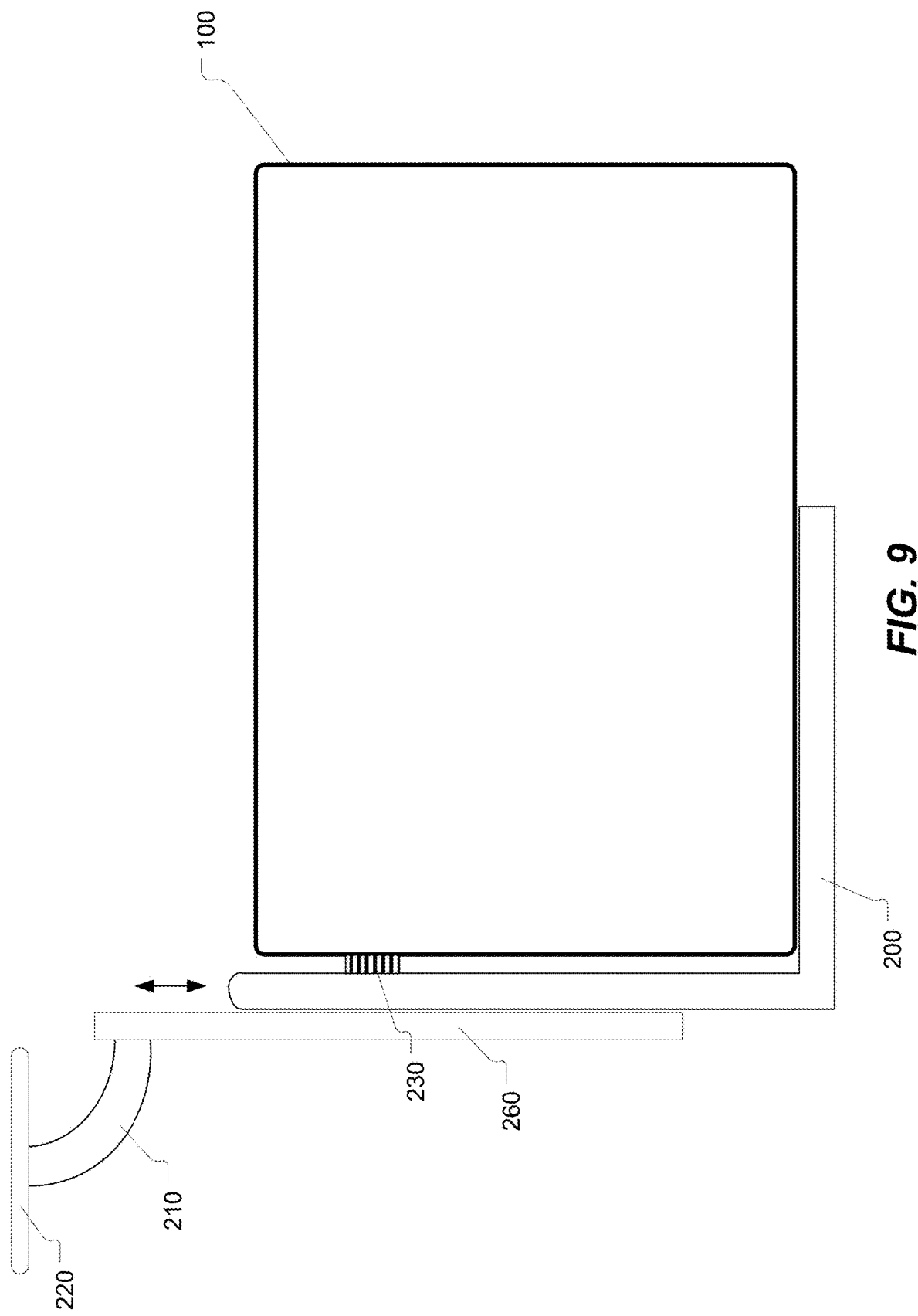
FIG. 9 depicts a tablet holder and a tablet in accordance with another embodiment of the present invention.

FIG. 9 depicts a holder with an orthogonally translating mechanism 260 to orthogonally translate the tablet relative to the holder. Orthogonally translating may mean translating the tablet in a generally vertical direction or in a plane generally parallel to the windshield. This mechanism also enables the tablet to be relocated relative to the user, e.g. lower down to attenuate incoming light and/or to be easier to read or operate.

Figure 10:
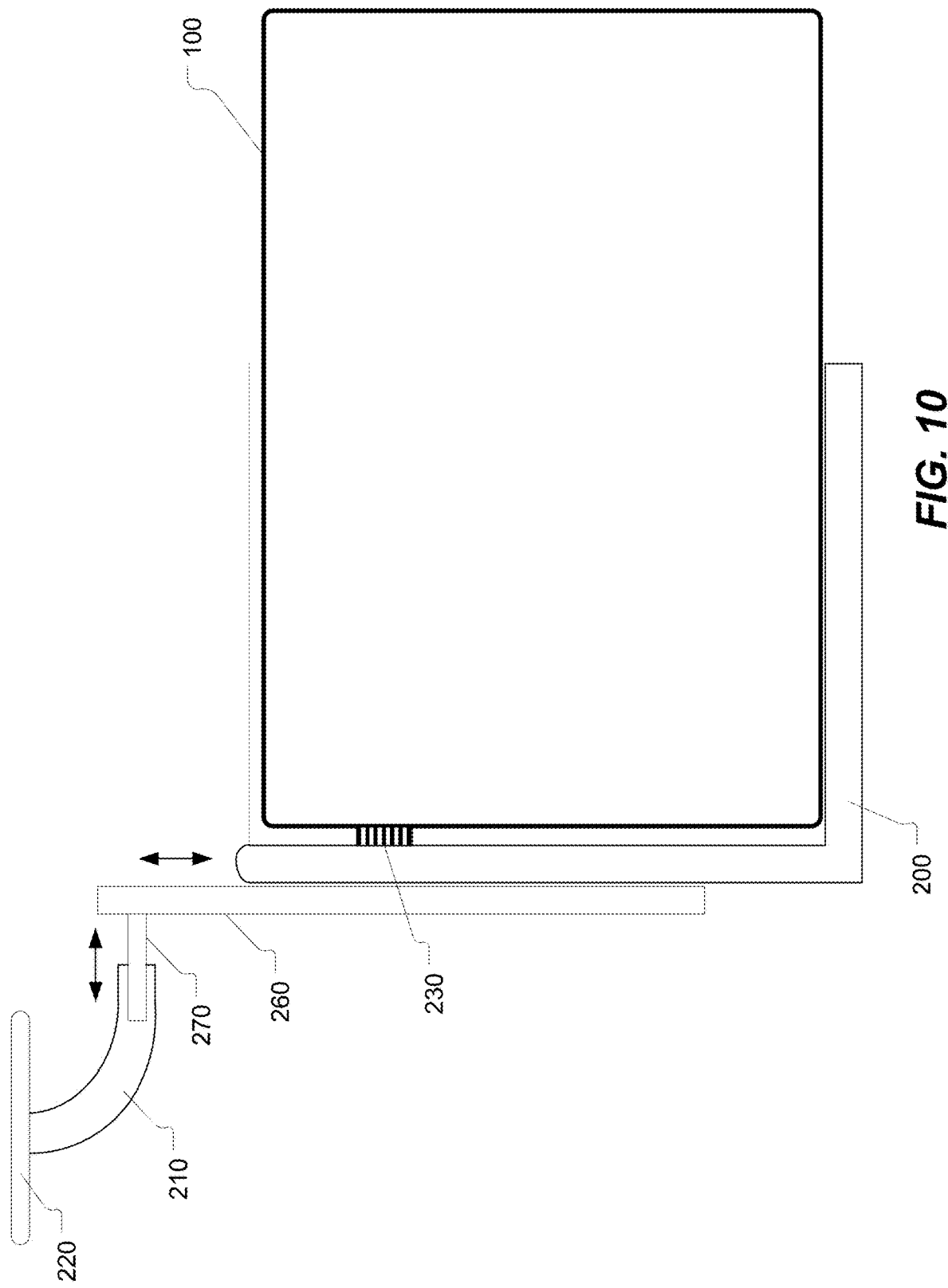
FIG. 10 depicts a tablet holder and a tablet in accordance with another embodiment of the present invention.

FIG. 10 depicts a holder with both an orthogonally translating mechanism 260 to orthogonally translate the tablet relative to the holder and a horizontally translating mechanism 270 to horizontally translate the tablet relative to the holder. In this particular case, the horizontally translating mechanism comprises a telescopic slider or other sliding mechanism.

In an embodiment, a controller or processor automatically repositions the tablet holder and the tablet held within the tablet holder based on a sensed condition or plurality of conditions including, without limitation, eyesight direction, detected driver position, incoming light and user settings. For example, the processor or controller may be configured to dynamically adjust the position of the tablet holder so that the tablet or the center of the tablet is aligned with the driver's line of sight.

Figure 11:
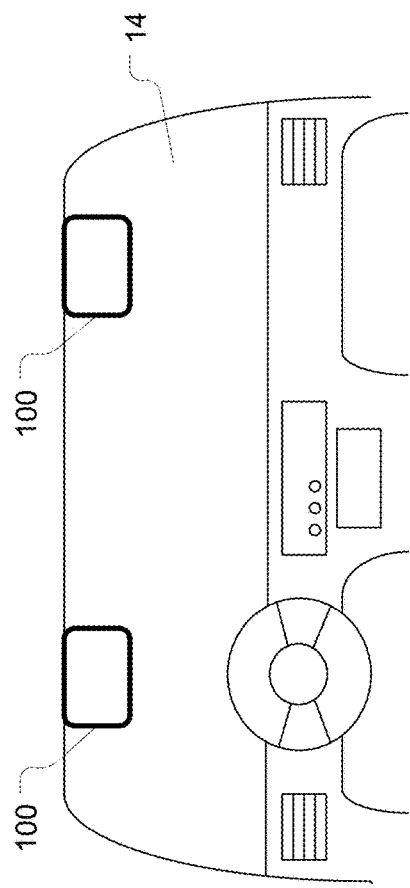
FIG. 11 depicts two detachable visor-like tablets mounted inside a cabin of a vehicle.

FIG. 11 shows a vehicle with both driver and passenger tablets 100 in tablet holders. Other tablet holders and tablets may be provided in other locations in the vehicle such as for rear passengers.

The tablet holder to be described herein may be used to hold a conventional non-transparent tablet on the driver side and/or on the passenger side. A car-specific or custom-made tablet may also be created by car manufacturers that work specifically with a particular type or make of car. The driver may use the non-transparent tablet as a visor when driving, may flip the tablet down for consulting a map, travel-related information, surf the web, check messages, weather or other onscreen information when stopped or parked, or may simply use the holder as a charger/holder for the tablet. The driver or passenger may also operate a tablet mounted on the passenger side. Two tablets may be mounted in the vehicle, i.e. one for the driver and one for the front passenger. Tablet holders may be mounted for rear passengers as well in other embodiments. The tablet(s) may also be operated in a self-driving car or autonomous vehicle by the idle driver.

The tablet may alternatively have a transparent OLED display. A transparent OLED glass display includes a first electrode (anode) formed on a substrate. The substrate is formed of a transparent, sturdy, thin material such as glass, but may be a flexible polymer such as polyethylene terephthalate (PET) or polyethylene naphthalate (PEN). A hole transport layer is formed on the first electrode. The first electrode and the hole transport layer may be, for example, indium tin oxide (ITO) or poly-3,4-ethylenedioxthiophene (PEDOT). An organic layer is an emission layer. An example of the emission layer is organo metallic compound such as tris (8-hydroxyquinoline) aluminum, also known as Alq3, formed on the hole transport layer. The hole transport layer could also be made of inorganic materials. An electron transport layer and a second electrode (cathode) are then formed over the organic layer. The electron transport layer typically is oxydiazole derivative (OXD). The first electrode is transparent while the second electrode, is typically a semitransparent cathode metal for achieving a transparent OLED display mode. A top substrate, similar in composition to that of bottom substrate, is formed over the second electrode.

In operation, a voltage from the voltage source is selectively applied across the first and second electrodes, causing electrons to flow from the cathode to the anode. The cathode gives electrons to the electron transport layer and the anode withdraws electrons from the hole transport layer thus causing the electron transport layer to become negatively charged and the hole transport layer to become full of positively charged holes. Electrostatic forces bring the electrons and holes towards each other where they recombine within the organic layer to emit light. For the transparent OLED structure with a semitransparent cathode, light is emitted through the bottom glass substrate as well as the top glass substrate. Transparency of the OLED display can be optimized by optimizing the transparent emission region of the pixel and the transparent see-through region of the pixel. Also, the efficiency of the transparent display can be optimized by utilizing a non-transparent cathode electrode and patterning it so that it is removed from the transparent see-through area of the pixel. In this structure, OLED light emission will be only in the direction of the viewer (driver or passenger), and the transparent see-through region of the pixel would have very high transmission.

In other embodiments, instead of using a transparent OLED for the tablet display and/or windshield, the transparent display screen or windshield may be made of any other suitable transparent display material such as see-through LED or see-through LCD.

In one embodiment, the transparent tablet is configured to provide dynamically adjustable shading either of the entire tablet screen or of only a discrete portion (or discrete portions) of the screen to reduce or attenuate intense or overly bright incoming light. The tablet may display navigation information (e.g. maps), augmented reality labels on objects visible through the tablet or vehicle information (e.g. dashboard-type information such as speed, RPM, gas tank fill status, engine temperature, etc.) to the driver which may be presented with or without concurrent shading.

The tablet may provide various functions either while attached to the holder or while detached from the holder. While detached, the tablet may be used by a passenger or by the driver (when the vehicle is immobilized or when operating a self-driving vehicle). For example, a passenger or driver of a self-driving car may use a tablet for playing games or viewing media content such as documents, photos or videos, for telephoning, for video conferencing (e.g. Facetime, Skype, etc.), for sending e-mail communications, for web browsing, etc. Once the battery has run low, the tablet may be reconnected to the holder to allow the tablet to be recharged. The passenger may then use another charged tablet, e.g. from the passenger side holder. The tablets are thus interchangeable for recharging. In one embodiment, the tablet holder is adapted and configured to receive one specific type or model of tablet. In another embodiment, the tablet holder may be adjustable or versatile enough to hold more than one type or model of tablet. The tablet may also be used to enter navigation commands, to operate an onboard entertainment system, adjust climate control, open windows, lock doors, configure the vehicle settings, or even to drive or operate the vehicle. These commands and user input can be entered when docked or when removed from the docking station. For example, the tablet may have a three-axis accelerometer which can generate left and right steering signals when the tablet is tilted left and right. Virtual controls may be displayed on the tablet to drive or operate the vehicle, which would be particularly suitable for giving instructions, directions, input or guidance to a semi-autonomously driven or self-driving vehicle.

In the holder, the tablet may be transparent, semi-transparent or partially transparent or opaque or even reflective. In one embodiment, a portion of the tablet display screen may provide a synthetic mirror-like screen to act as a vanity mirror. A camera image may also be displayed to provide a mirror-like image. A light on the tablet may be illuminate to replicate the vanity light and mirror appearance of conventional visor mirrors.

In another embodiment, the tablet display screen may be shaded to act as a visor. The degree of opacity (or conversely the degree of transparency) may be automatically adjusted or, alternatively, adjusted in response to user input (e.g. manual input or voice command). The user may speak a command like "make screen darker" or "darken visor" to cause the device to increase the shading of the OLED display. Alternatively, a luminosity sensor (either on the tablet) or on the automobile may be used to sense the amount of ambient light to enable the tablet to automatically adjust its transparency or opacity. A touch-sensitive user interface element such as a slider may be used to adjust transparency (or conversely opacity) from, from example, 0% to 100%.

In another embodiment, the tablet display screen may dynamically generate onscreen patches of opaque or semi-opaque shapes to block out, or at least attenuate or shade, the visibility-impairing effects of the rising or setting sun or oncoming headlights or high beams. In other words, the display may be transparent except for a shape (e.g. circle or polygon) that is dynamically generated onscreen at an appropriate onscreen location to block out the incident light. This provides a partial dynamic visor that blocks unwanted light over a certain intensity. This may be triggered using a light sensor or only at night or during the times corresponding to the rising or setting sun. This technique may require an eye sensor to detect the direction of vision of the driver or passenger of the vehicle to geometrically determine where to place the light-blocking shape onscreen while leaving the rest of the screen transparent.

In another embodiment, the tablet display screen may display navigation information such as a map, navigation arrows, street names, 3D rendering, augmented reality view, or any combination thereof.

Figure 12:
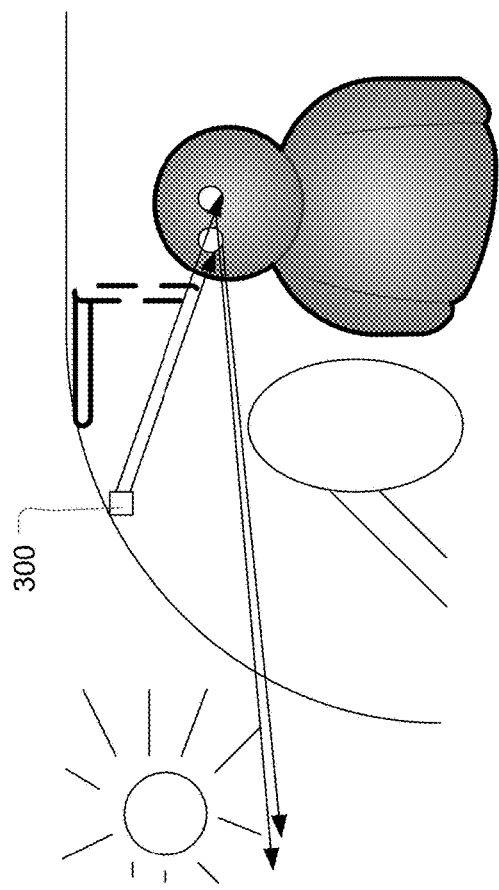
FIG. 12 depicts an eye-tracking sensor for selectively shading a transparent tablet.
Figure 13:
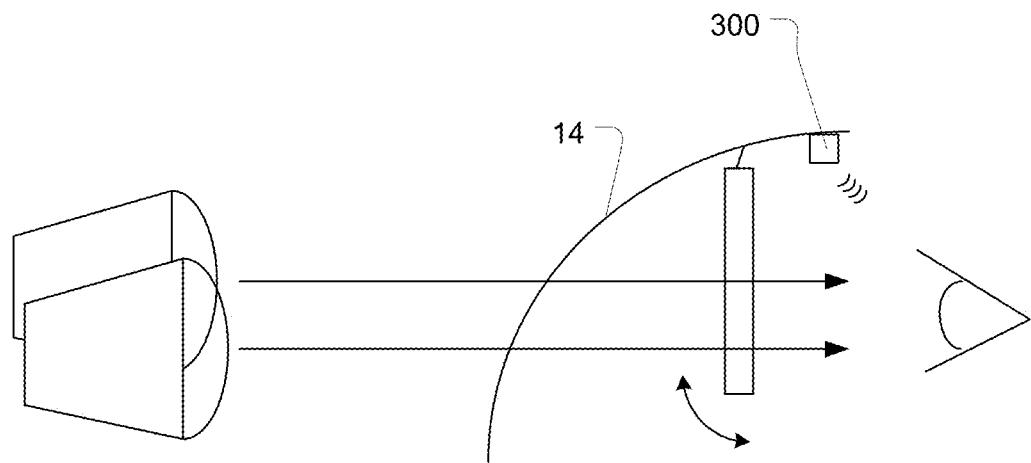
FIG. 13 is a schematic depiction of the tablet attenuating light from oncoming headlights.

As shown in FIG. 12, the automobile may include an eyesight-direction sensor (eye tracker) 300 for determining an eyesight vector representing a direction of vision of the driver. This eyesight vector may be used to geometrically compute a spot or area on the tablet that may be shaded to attenuate incoming light (e.g. sunlight in FIG. 12 or headlights in FIG. 13) that is above a predetermined light intensity threshold. This would attenuate the blinding effect of the bright headlights of oncoming vehicles at night or in low-light conditions (such as in a tunnel). The device may both attenuate the headlights and enhance the road imagery to provide better overall night vision for the driver. The eye tracker may use the camera on the tablet or it may use a separate cabin-mounted eye sensor.

Figure 14:
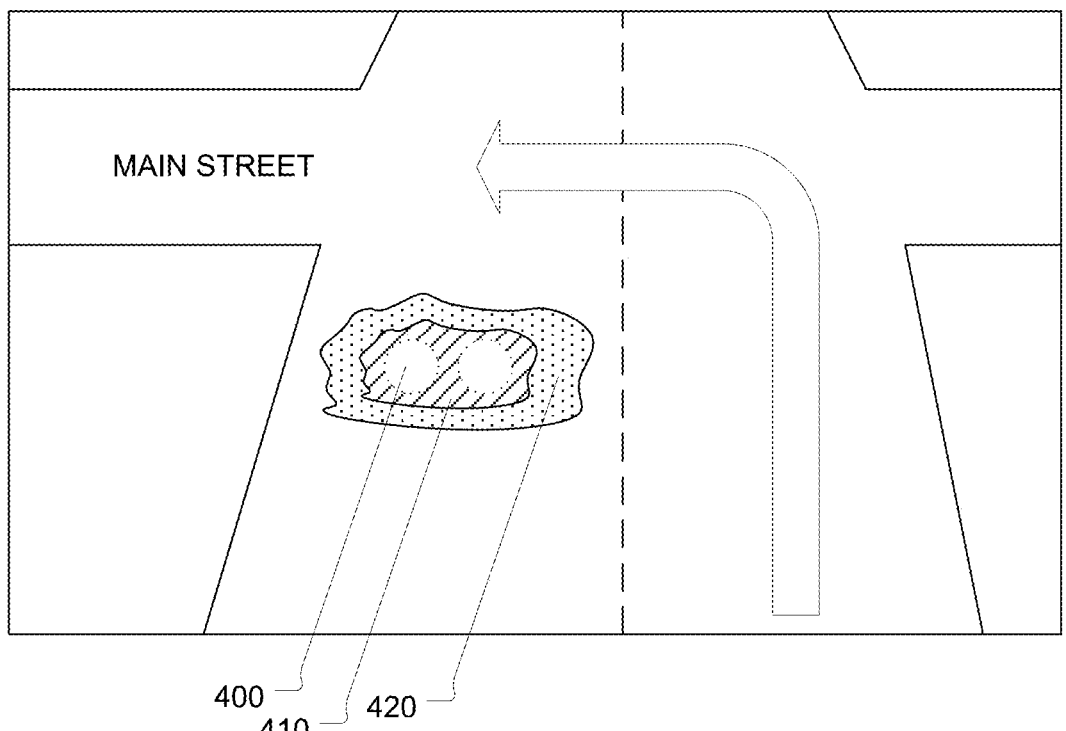
FIG. 14 depicts a transparent tablet on which a portion of the screen is shaded to attenuate the incoming light.

FIG. 14 depicts a tablet displaying by way of example a map with an arrow presenting a visual navigational instruction to the user or driver. In this example, the twin headlights of an oncoming car are attenuated by partially shading a discrete portion 400 of the display screen of the tablet. In this example embodiment, there may be differently shaded regions. For example, the inner region 400 of greatest light intensity may be shaded more opaquely than a proximal region 410 of slightly lesser intensity, i.e. a surrounding region that immediately surrounds the inner region. In this example, a distal region 420 of even lesser intensity is shaded less opaquely than the proximal region. Each region represents a portion of the display screen that is shaded on a pixel-by-pixel basis to form any arbitrary shape or polygonal region.

Figure 15:
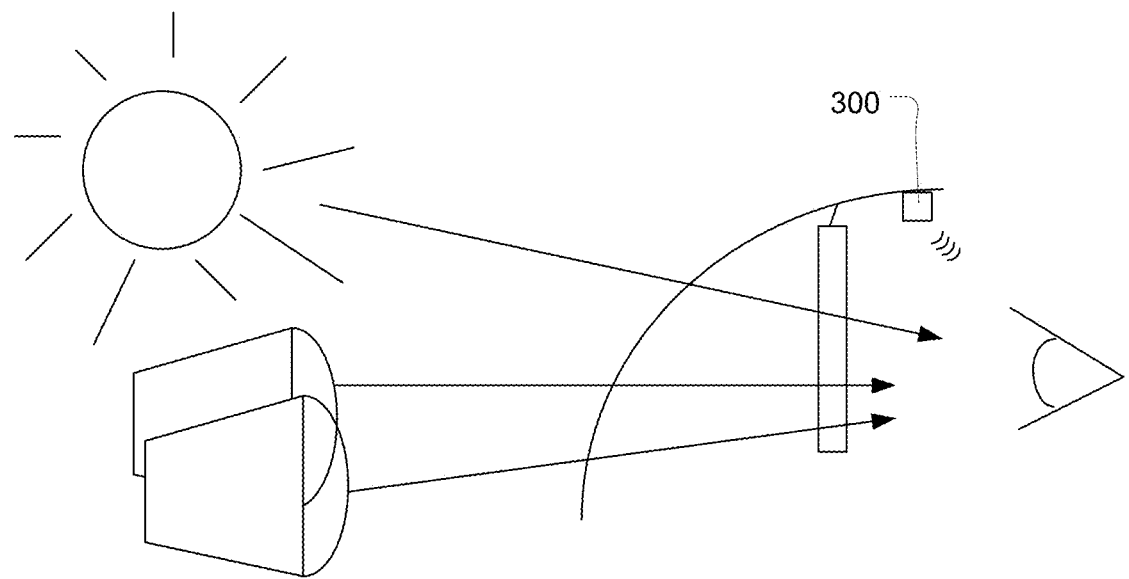
FIG. 15 is a schematic depiction of the tablet attenuating light from oncoming headlights and from the sun.
Figure 16:
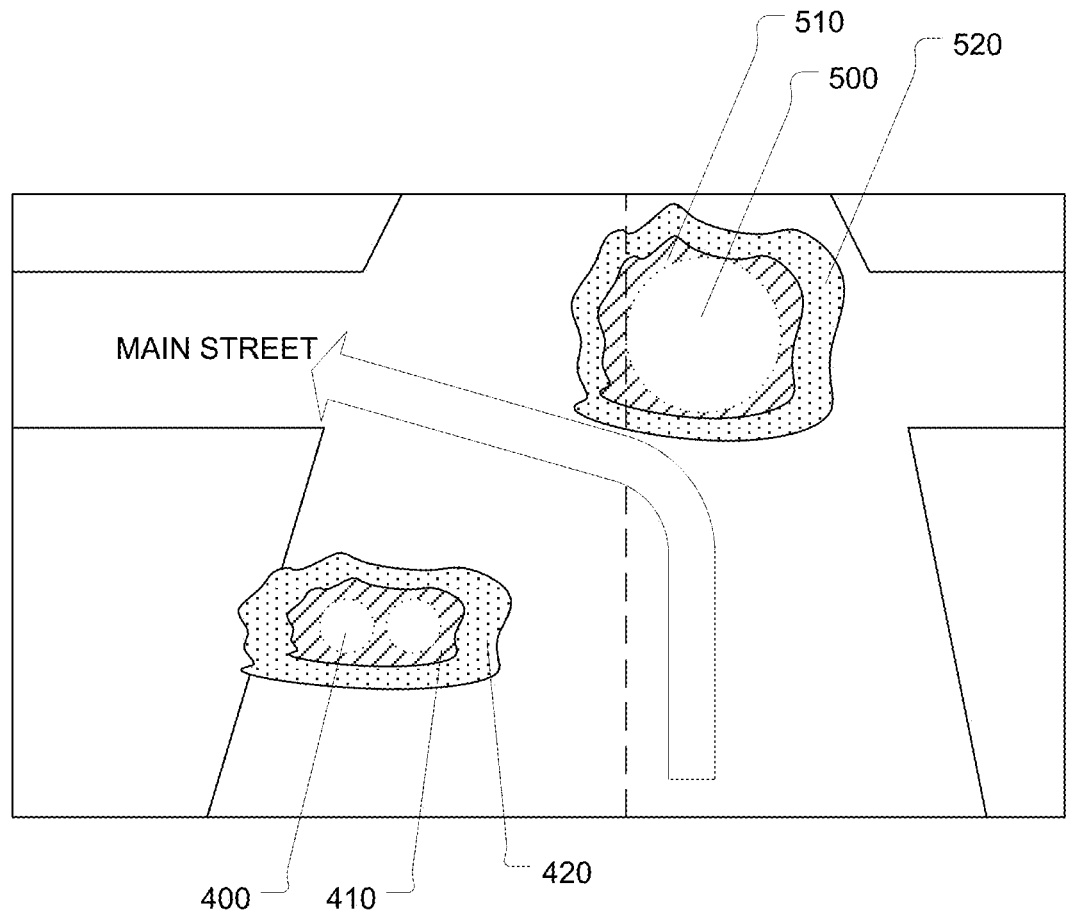
FIG. 16 depicts a tablet on which a portion of the screen is shaded to attenuate the incoming light.

The processor of the tablet is thus configured to cause the display screen to partially shade any arbitrarily sized and shaped discrete portion of the display screen. The processor may alternatively be configured to cause the display screen to partially shade a plurality of discrete portions of the display screen. FIG. 15 depicts a scenario where intense light is emitted by two sources, e.g. the sun and headlights. In FIG. 16, the tablet shades two regions each with differential gradations of shading. In FIG. 16, the incoming light from the headlights are attenuated by generally regions of decreasingly opaque shading 400, 410, 420. In FIG. 16, the incoming light from the sun is attenuated by regions of decreasingly opaque shading 500, 510, 520.

Information presented onscreen may be presented while the screen is partially transparent (i.e. partially opaque). As the screen is dynamically shaded, or as portions of the screen are dynamically shaded, the font of textual information displayed onscreen may also be dynamically adjusted, e.g. in size or color, to maximize or at least improve readability.

Enhanced vision technologies may be employed such as FLIR (forward looking infrared) or thermal imaging by a FLIR camera or a thermal imaging camera mounted on the vehicle. The imagery or video from these FLIR or thermal imaging cameras may be displayed on the tablet. The use of a tablet is more ergonomic for the driver than military-style night-vision goggles which are uncomfortable and heavy to wear, which may collide with the side window when the driver turns his head, have limited field of view, and which impede in-cabin viewing of instruments and controls.

In most embodiments, the tablet is detachable from the holder. In some other embodiments, though, the tablet may be replaced with a built-in variably transparent visor pivotally held in place by a pivoting support bracket or holder. In the later embodiments, the variably transparent visor is adjustable in transparency or opacity and may display navigation information or other information on the visor screen.

The tablet may be used to display real-time camera imagery or video feeds from one or more cameras mounted on the vehicle, e.g. back-up camera, forward-looking camera, side view camera, etc.

In a self-driving vehicle or an aircraft on auto-pilot, the tablet may be used to display other content, e.g. video conference, messages, weather updates, traffic updates, maps, images, training videos, or entertainment such as movies, TV shows, games, web navigation interfaces, etc. Content may be displayed at maximum opacity thereby obscuring the ability to see through the OLED screen or it may be displayed at partial opacity so that the content imagery is displayed as a ghost image (partially transparent) while still permitting the user to see through the display.

The tablet may power off automatically in response to the tablet being stowed (pivoted upwardly out of the line of vision). This may be done using a tilt sensor or gyro or accelerometer in the tablet. Likewise, the tablet may power on automatically in response to the tablet being deployed (pivoted downwardly into the line of vision). In one embodiment, the tablet automatically deploys or stows (e.g. automatically pivots using a drive motor or servo) in response to a trigger condition. The trigger condition may be the turning on or off of the vehicle ignition or main electric power of the vehicle, the sensing of an imminent accident, the arrival at a predetermined location, or a biometric condition sensed from the driver.

In some embodiments, the tablet or OLED visor may be rotated sideways to the side window of the vehicle although this would be for shading only since the information would not be readable when viewed through the back of the tablet or visor. The holder may include an adjustable frame to furthermore slide or translate the tablet vertically, horizontally or along another axis of motion.

In other vehicle applications, the tablet or visor may be used on buses, e.g. tour buses, trains or boats. The visor may be used for the pilot, captain or driver but also for passenger windows.

In some embodiments, the visor may be driven by a motor and may be configured to be automatically folded up (stowed) when the vehicle is shut down or after a prescribed period of inactivity.

A visor may be employed for a pilot and co-pilot in an aircraft or helicopter. A slide-down version of the visor may be installed in the passenger windows of a passenger aircraft. The visor may be adjustable in shading to attenuate overly bright sunlight, to present augmented reality overlay information (labeling cities or landmarks that are visible through the window). The same concept may be used for tour buses to provide both shading and augmented reality information or labeling of sights. The tourist may touch the screen at an onscreen location corresponding to a landmark, point of interest or other object to obtain more information about that landmark, point of interest or object. The other information may be obtained by requesting data from a database, web service or making a search request to a search engine.

The tablet-holder and the automobile equipped with the tablet-holder enables innovative methods of interacting with a vehicle and the tablet. One such method entails displaying on a transparent tablet navigation information (e.g. maps, augmented reality, augmented vision such as FLIR or thermal imaging or other heads-up display (HUD) information about the vehicle) and shading the screen in response to a light condition. The light condition may be intense sunlight or headlights of an oncoming vehicle, for example.

The tablet may be removed from its holder and used to photograph or video the vehicle, e.g. engine, tires, or other components or parts. The tablet may thus be used to diagnose, report problems, maintain, service and repair the vehicle. The tablet may display overlay labels and instructions to the user, both visually and audibly, to enable the user to repair or service the engine or other components of the vehicle.

The holder may be able to reversibly hold the tablet in either a normal position, i.e. with the display screen facing into the cabin when deployed, or in a reversed position, i.e. with the display screen facing outwardly and thus visible through the windshield when deployed. This may involve having a rotatable power/data port to accommodate asymmetrical power/data sockets. In a reversed position, the tablet may be used to display information through the windshield such as, for example, parking permits, vehicle identification information, license information, taxi or ride-sharing information, pricing for new cars in showrooms, rental car identification information, emergency information, etc.

The holder may be a bracket, support, mount, frame or any suitable mechanism to hold the tablet. One example holder mechanism is disclosed in U.S. Patent Application Publication 2008/0164715, which is hereby incorporated by reference. Another example holder mechanism is disclosed in U.S. Patent Application Publication 2009/0079224, which is hereby incorporated by reference.

In another embodiment, the holder may be dimensioned to accommodate (i.e. hold or receive) a phablet, i.e. a mini-tablet or e-reader or any other size or type of tablet.

In another embodiment, the holder may be dimensioned to accommodate (i.e. hold or receive) a mobile device such as a smart phone, cell phone, or other such wireless communication device.

Figure 17:
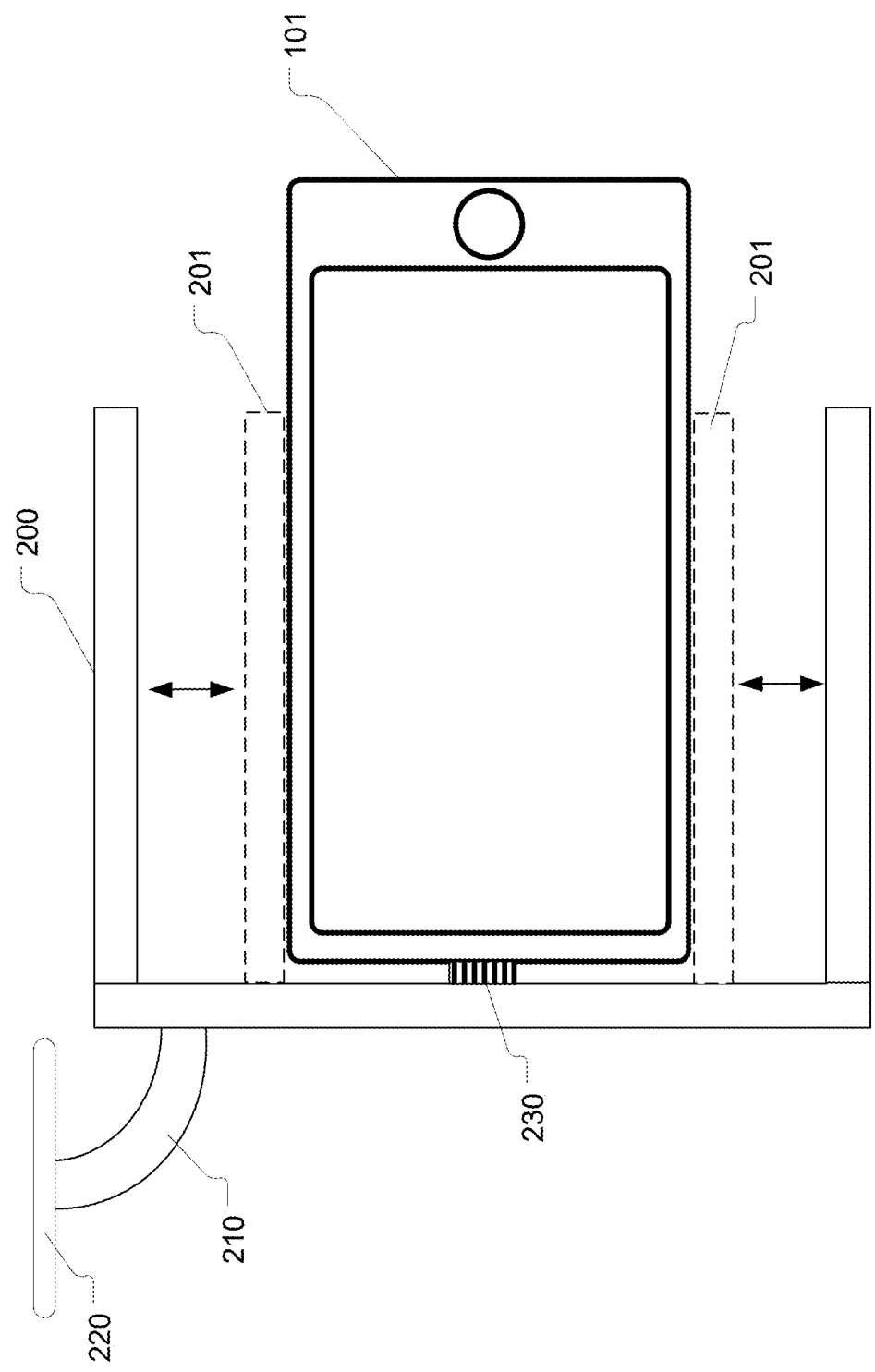
FIG. 17 depicts an adjustable holder for holding a mobile device in accordance with another embodiment.

FIG. 17 depicts an adjustable holder 200 for holding a mobile device 101 such as a smart phone, cell phone or other such wireless communication device in accordance with another embodiment. In the embodiment illustrated in FIG. 17, the bracket 200 includes adjustable (e.g. sliding) horizontal bracket members 201 that slide orthogonally to hold or retain differently sized mobile devices. This enables a single holder to be used with mobile devices of different width. In this example, it is assumed that the different mobile devices still fit the same power/data port. In a variant, the power/data port may have an adapter to connect to different types of sockets for different types of mobile devices. In another variant, the power/data port may be replaceable with a different type of power/data port. The mobile device may connect to any of the onboard computers, navigation system and/or entertainment system of the vehicle via the data/power port in addition to, or in lieu of, a short-range wireless connection such as Bluetooth.

In some embodiments, the rear surface of the tablet may have solar cells to harvest or collect solar energy to recharge the tablet when deployed such that the rear surface of the tablet is exposed to solar radiation (during sunlight hours) through the windshield of the automobile.

In some embodiments, the mobile device stores user-specific data, such as a personal certificate, token, cryptographic material or personal identifier, that authenticates the driver to thereby enable the vehicle to be started and driven. For example, in some implementations, the data stored in the memory of the mobile device can be used as a digital key to start and operate the car. In another implementation, the mobile device pairs or connects with the vehicle and uses one or more of facial recognition, voice recognition, digital fingerprint and/or other biometrics to ascertain the identity of the driver before starting the car. This technology enables the creation of a whitelist of approved drivers for a particular vehicle. For example, the owner of a vehicle may send vehicle permission data to a friend's mobile device (or tablet) with the requisite authentication information permitting that friend to use the owner's vehicle. The permission to use the owner's vehicle by the friend may be limited in time and space. Permission data may also limit the performance of the vehicle, e.g. how fast it can go, how far it can go, how fast it can accelerate, etc. Thus, the permission data may include a time parameter and/or a spatial parameter and/or a performance parameter. As another example, a car rental agency may transmit permission data to a customer to permit the customer to use a particular vehicle that the car rental agency has agreed to rent to the customer. As a further example, an unmanned autonomous vehicle operating as a taxi or in a private system such as Uber may require authentication data from a customer. The authentication data from the customer's mobile device may be obtained using near field communication (NFC) or any equivalent short-range data communication protocol to ascertain that the user is entitled to board the vehicle. This might unlock the door of the unmanned autonomous vehicle.

Figure 18:
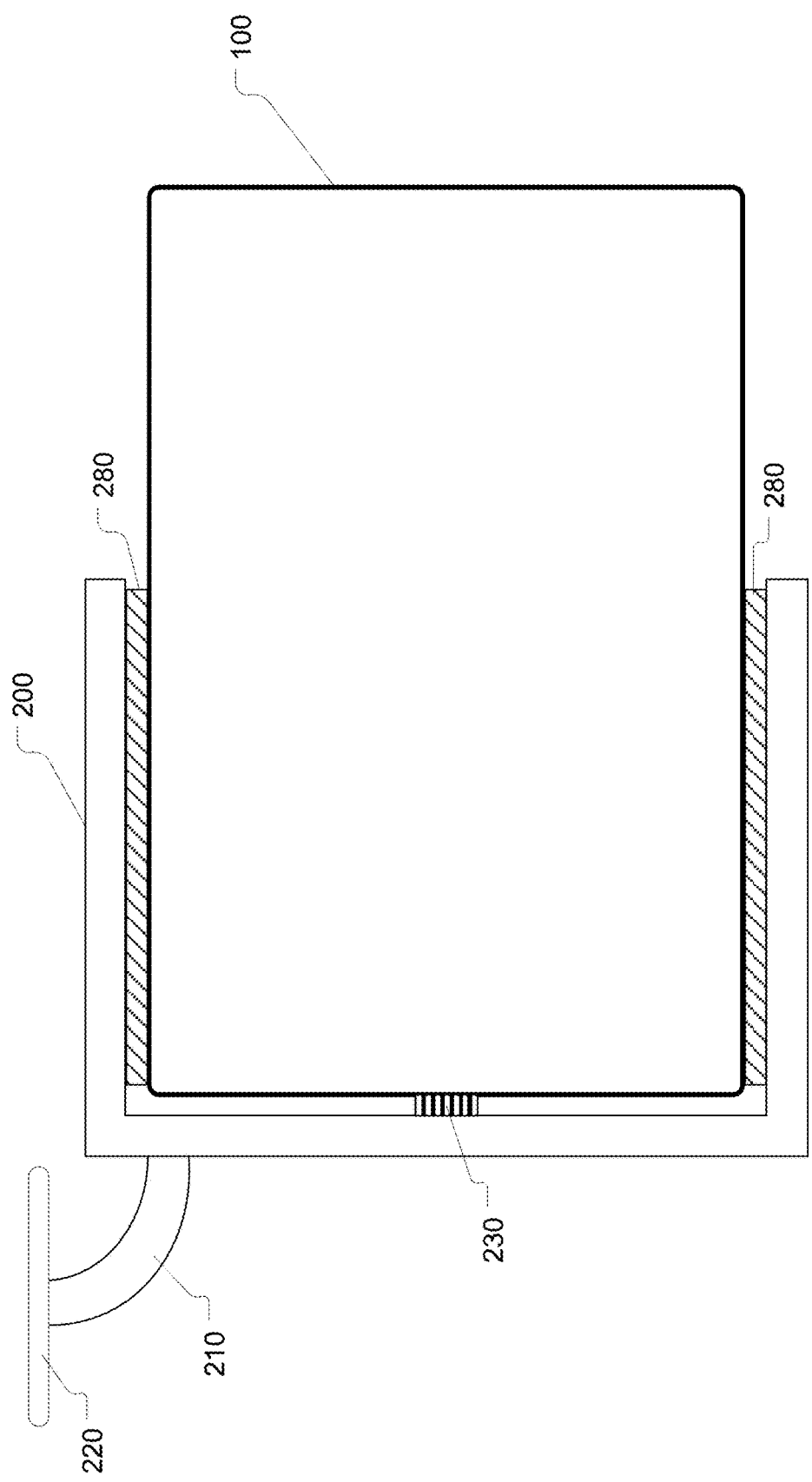
FIG. 18 depicts a tablet holder having a vibration-attenuating liner in accordance with another embodiment.
Figure 23:
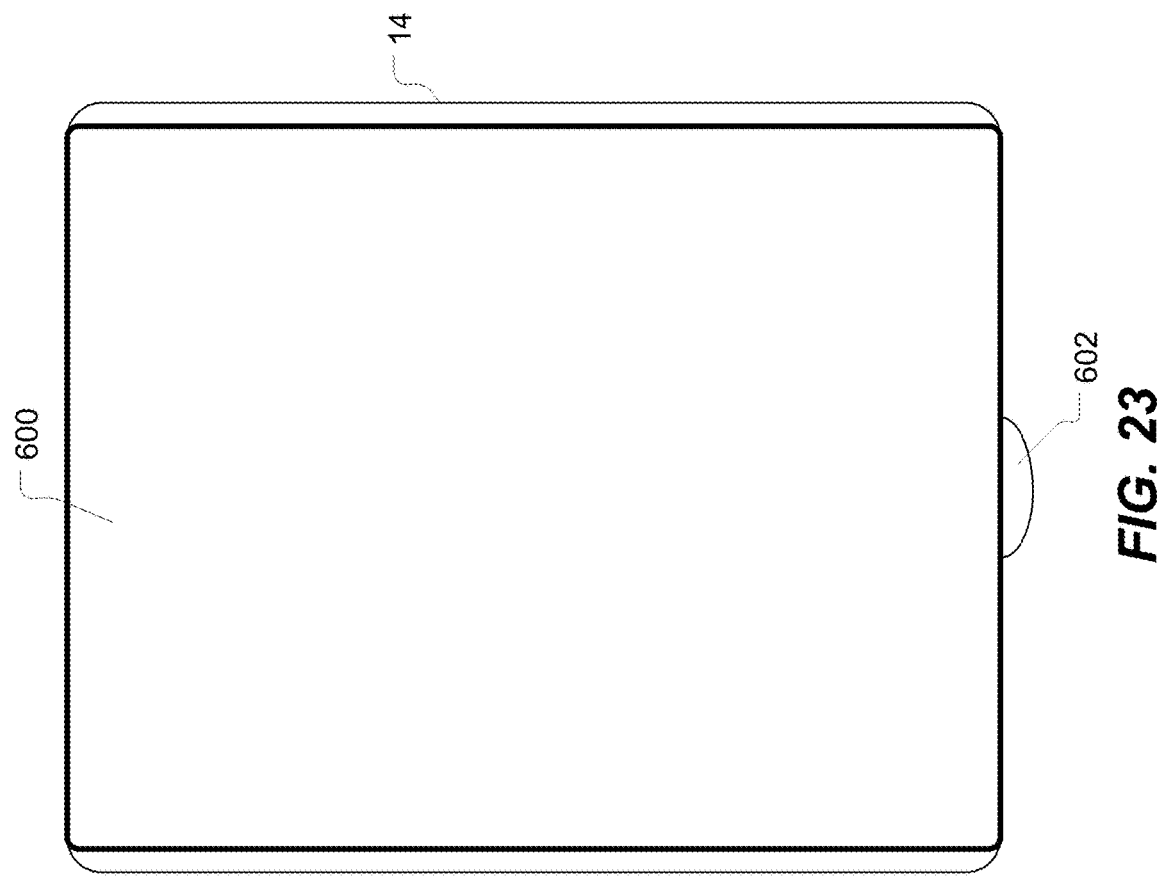
FIG. 23 depicts the tablet-like sun shade in its deployed position.

FIG. 18 depicts a tablet holder having a vibration-attenuating liner 280 in accordance with another embodiment. The liner 280 may be made of a rubberized or elastomeric material or any other suitable polymer or plastic, felt, felt-like material, etc. that deforms resiliently to receive the tablet and to attenuate vibrations.

FIG. 19 depicts a tablet holder having grooves 290 for holding the tablet in accordance with another embodiment FIG. 20 is an end view of the tablet holder and tablet of FIG. 19 showing the grooves 290 for receiving the tablet. The grooves may be of a fixed width for a predetermined tablet thickness or may be adjustable to accommodate different thicknesses of tablets.

FIG. 21 depicts a contoured sun visor 205 for an automobile having a receptacle 207 for holding a tablet in accordance with another embodiment of the invention. In this embodiment, the tablet is slid into the receptacle along an axis perpendicular to a pivot axis. In this and other embodiments, it is not necessary that the tablet be connected to the vehicle for power and/or data. The tablet may operate without power or data from the vehicle. The tablet may be, in some embodiments, transparent to enable the driver to see through the tablet. The tablet may selectively shade the display screen to attenuate light. By shading, it is understood that this includes coloring and/or tinting.

Figure 22:
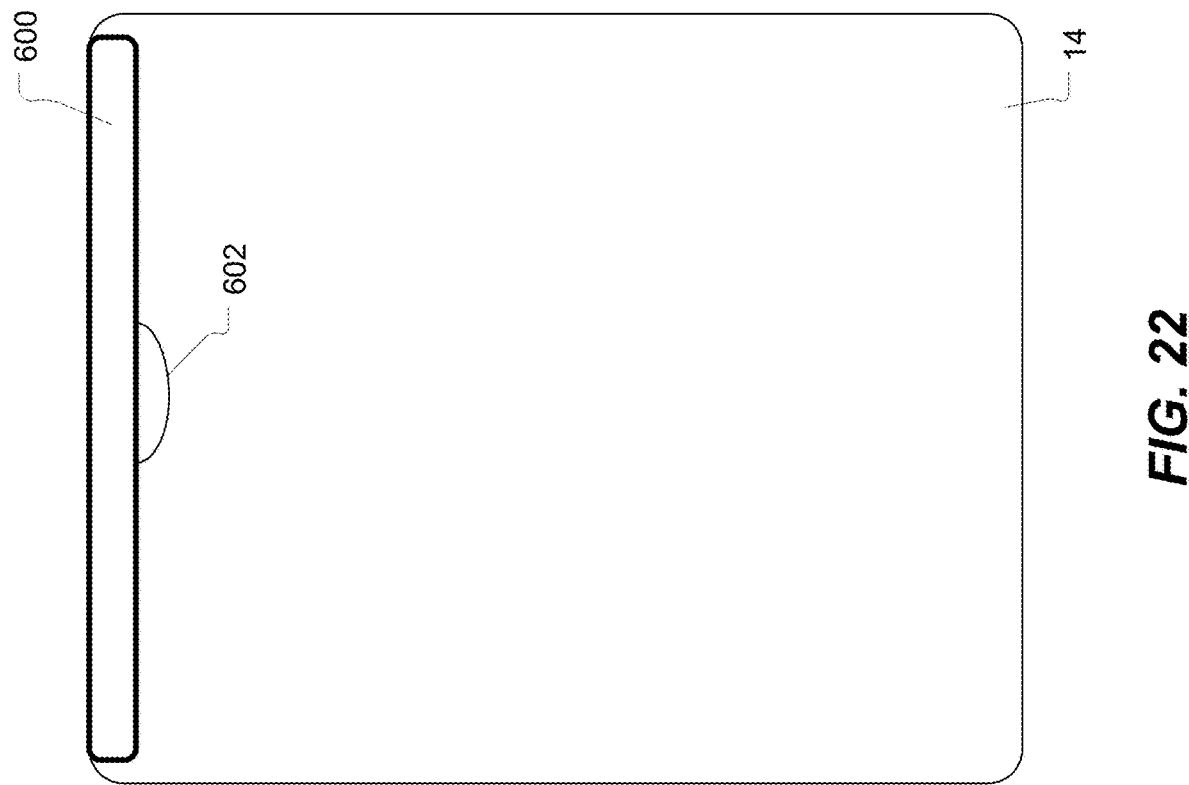
FIG. 22 depicts a tablet-like sun shade in its stowed position in accordance with another embodiment of the invention.
Figure 25:
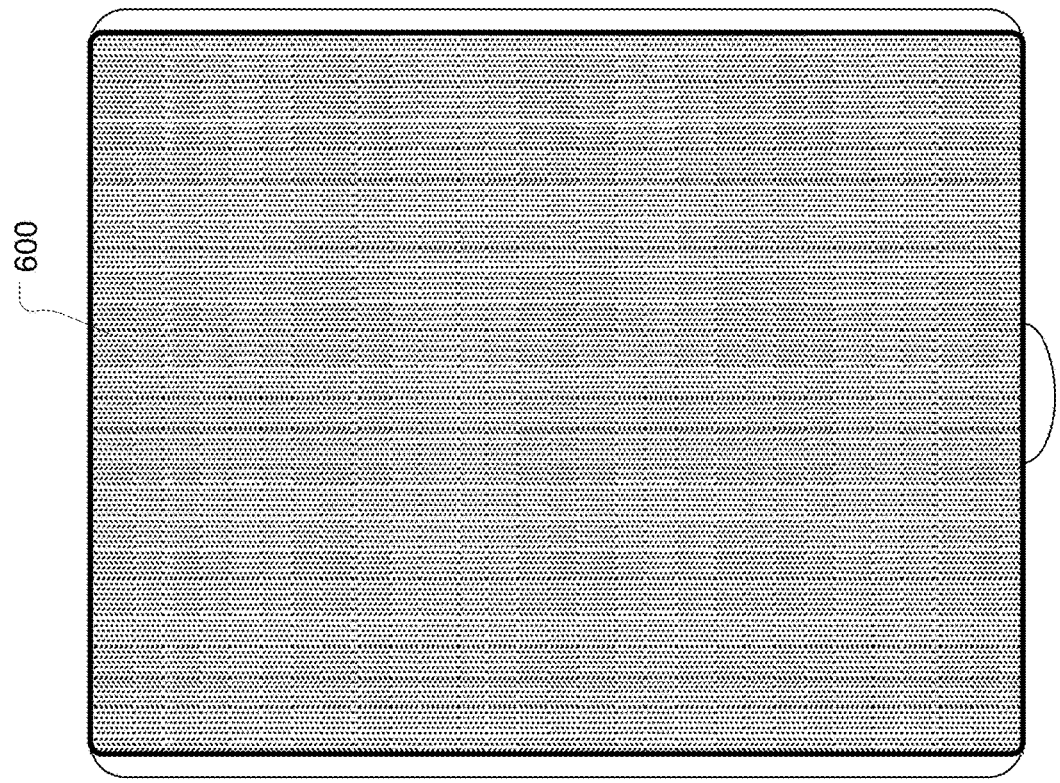
FIG. 25 depicts a second example of a shaded display of the tablet-like sun shade of FIG. 23.
Figure 24:
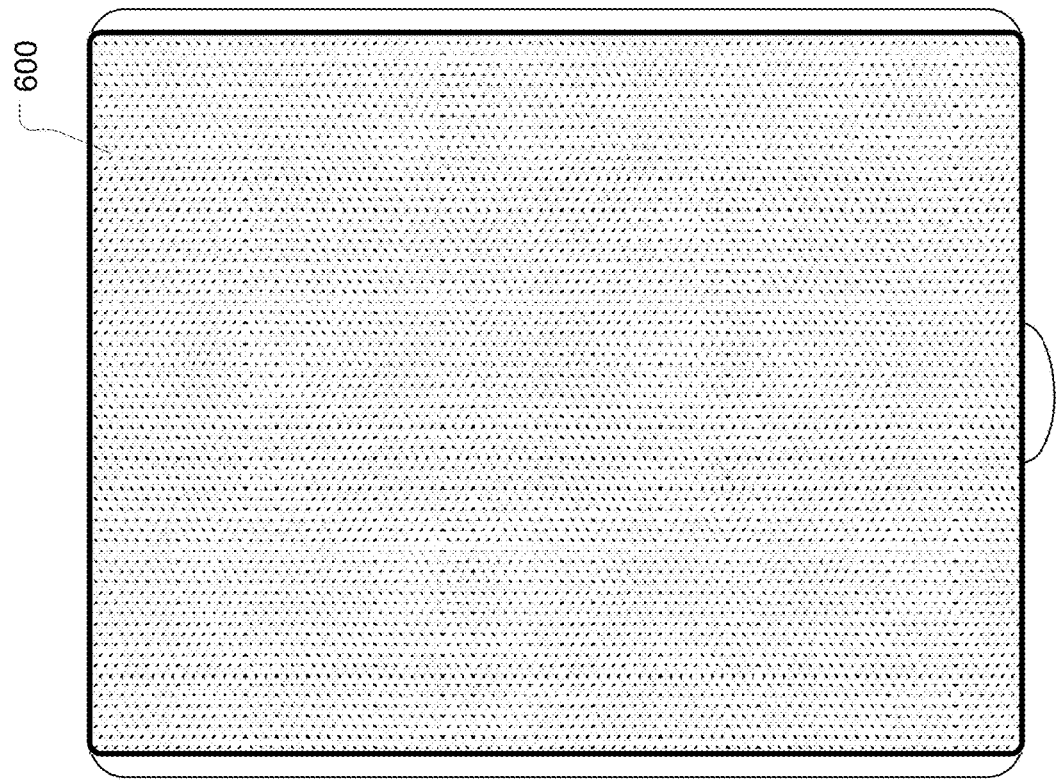
FIG. 24 depicts a first example of a shaded display of the tablet-like sun shade of FIG. 23.
Figure 27:
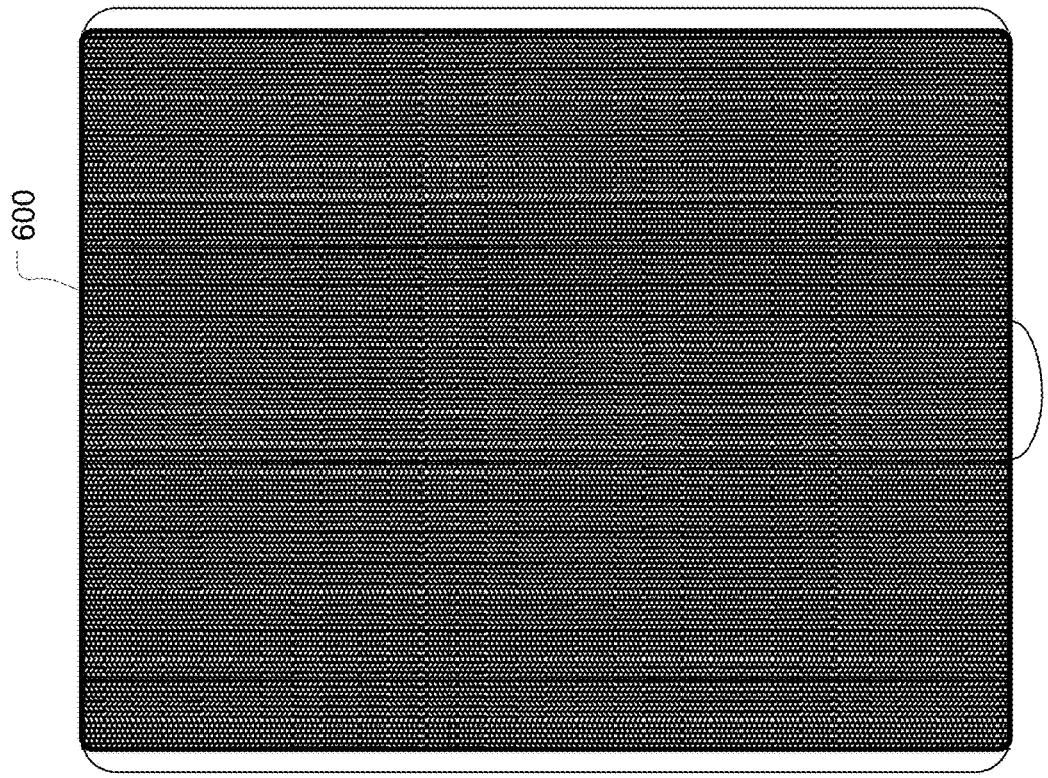
FIG. 27 depicts a fourth example of a shaded display of the tablet-like sun shade of FIG. 23.
Figure 26:
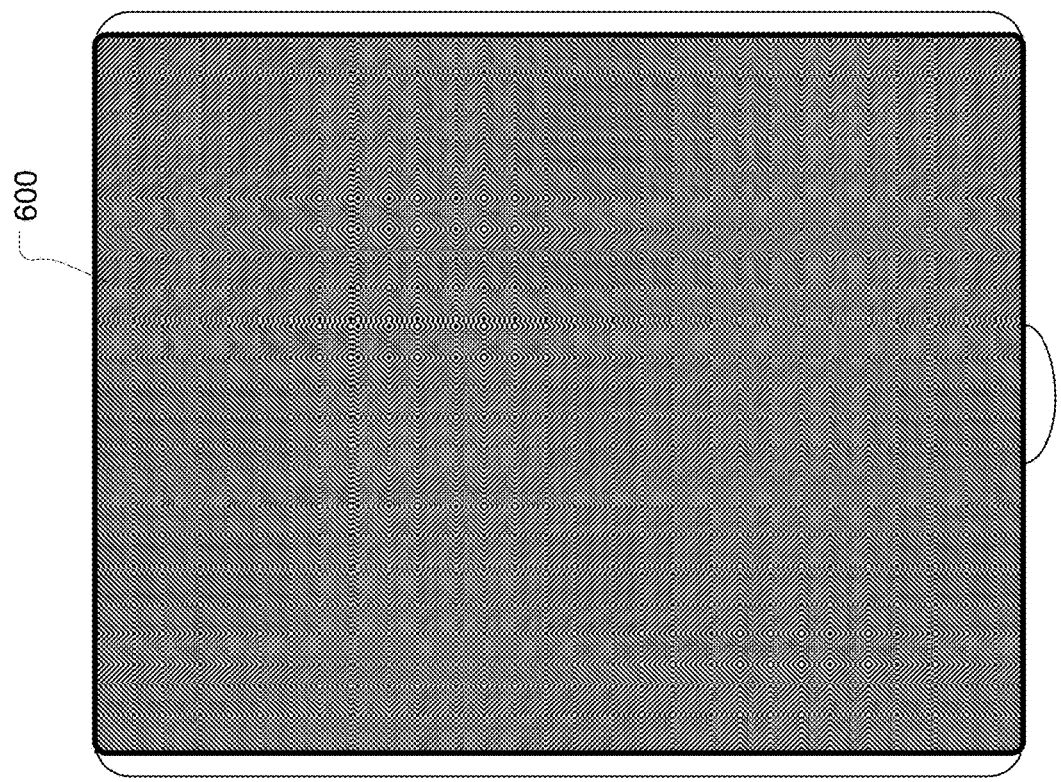
FIG. 26 depicts a third example of a shaded display of the tablet-like sun shade of FIG. 23.

FIG. 22 depicts a tablet-like sun shade 600 for an aircraft or other analogous application in accordance with another embodiment of the invention. In this embodiment, the tablet-like sun shade 600 is slidable in a manner analogous to conventional sun shades on passenger windows of aircraft. The tablet-like sun shade 600 may have a protrusion, tab or finger hold 602 to enable the tablet-like sun shade to be lowered and raised. The tablet-like sun shade 600 is generally vertically slidable between a stowed position in which the tablet-like sun shade is raised into the bulkhead or other space above the window and a deployed position in which the tablet-like sun shade is lowered beside the window to thus substantially cover the window. The concept may be applied to a train window, bus window or other vehicle that has sun shades for its passengers.

FIGS. 24-27 show increasingly shaded transparent tablet-like sun shades 600 that are shaded either in response to user input or automatically, i.e. by the processor determines intelligently when to apply shading to the display screen.

Figure 28:
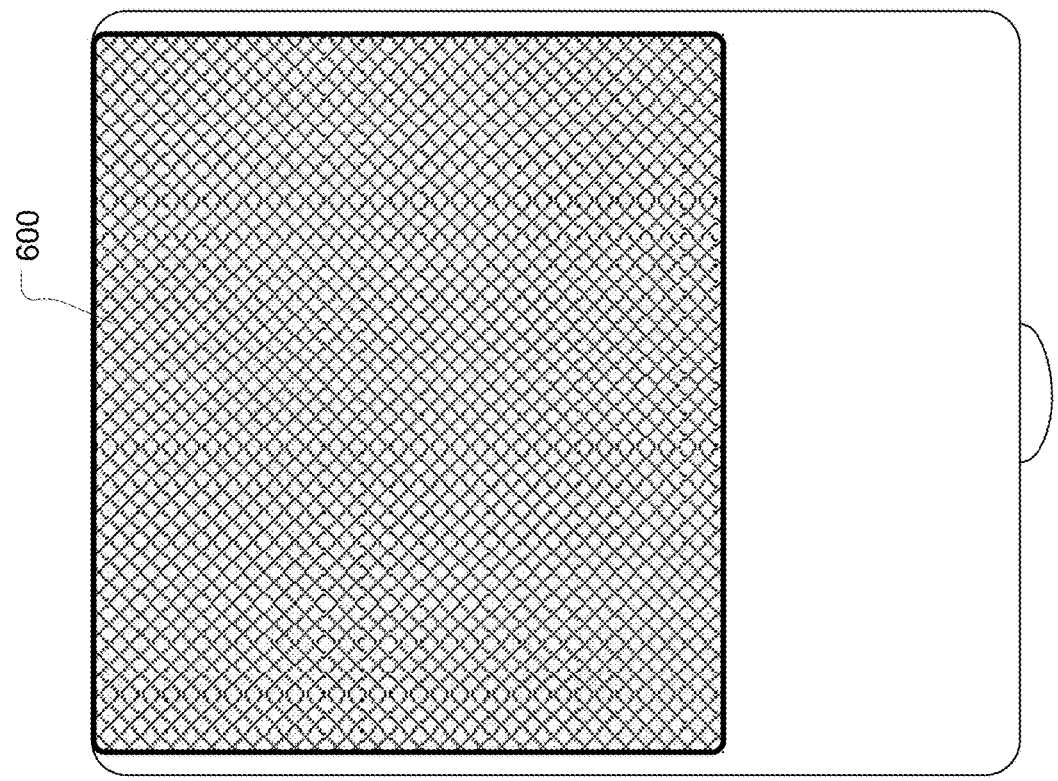
FIG. 28 depicts the tablet-like sun shade with concentrically shaded regions for attenuating intense incoming light.

FIG. 28 depicts the tablet-like sun shade 600 with concentrically shaded regions 610, 620, 630 for attenuating intense incoming light. The concentric regions are decreasingly shaded in a radially outward direction. Although three concentric regions are depicted, there may be a different number of regions in other embodiments. The radial spacing of the concentric regions may be varied as well. In another embodiment, there may be only a single circular region. In other embodiments, the shape is not circular but polygonal or any arbitrary shape.

Figure 29:
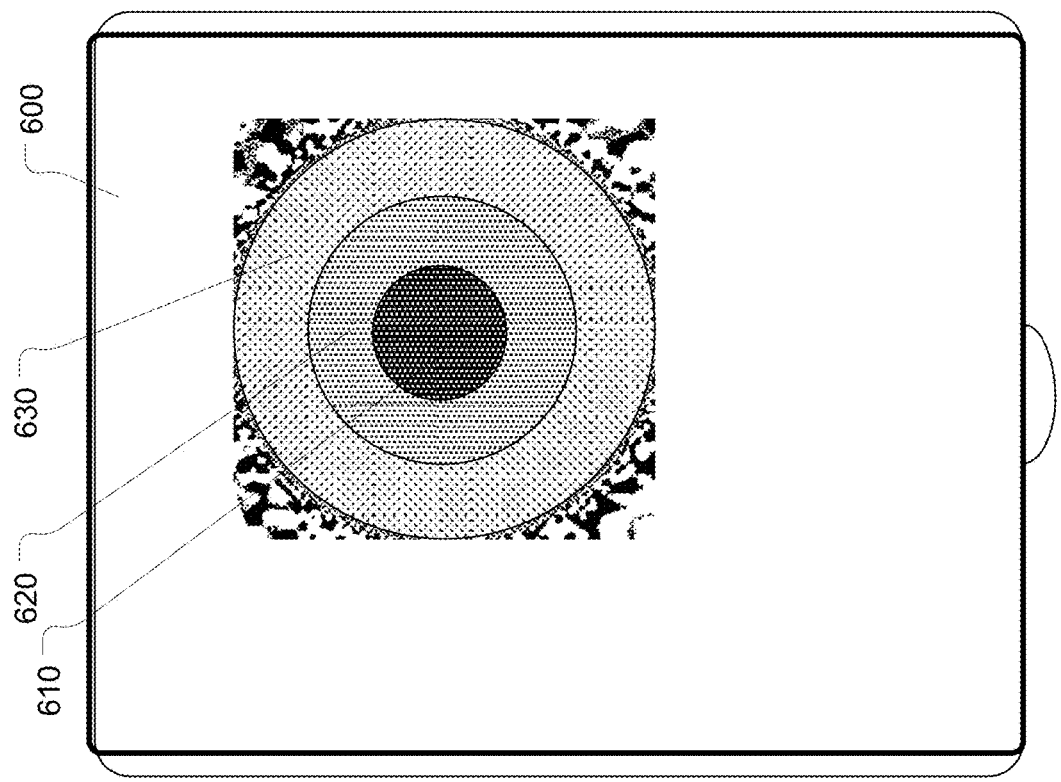
FIG. 29 depicts a window in which part of the window is a transparent shadeable touchscreen display.

In the embodiment depicted by way of example in FIG. 29, the transparent tablet-like sun shade 600 is the window itself, or is integrated into the window as a second pane with or without a gap or is otherwise attached permanently to the window with or without a gap. The user may activate the screen shading by touching the tablet or by providing user input to the tablet. Alternatively, screen shading may be activated automatically. In addition to shading, the tablet may function as a computing tablet providing e-mail and messaging, web browsing, games, entertainment, software utilities, weather, news, apps, etc.

Figure 31:
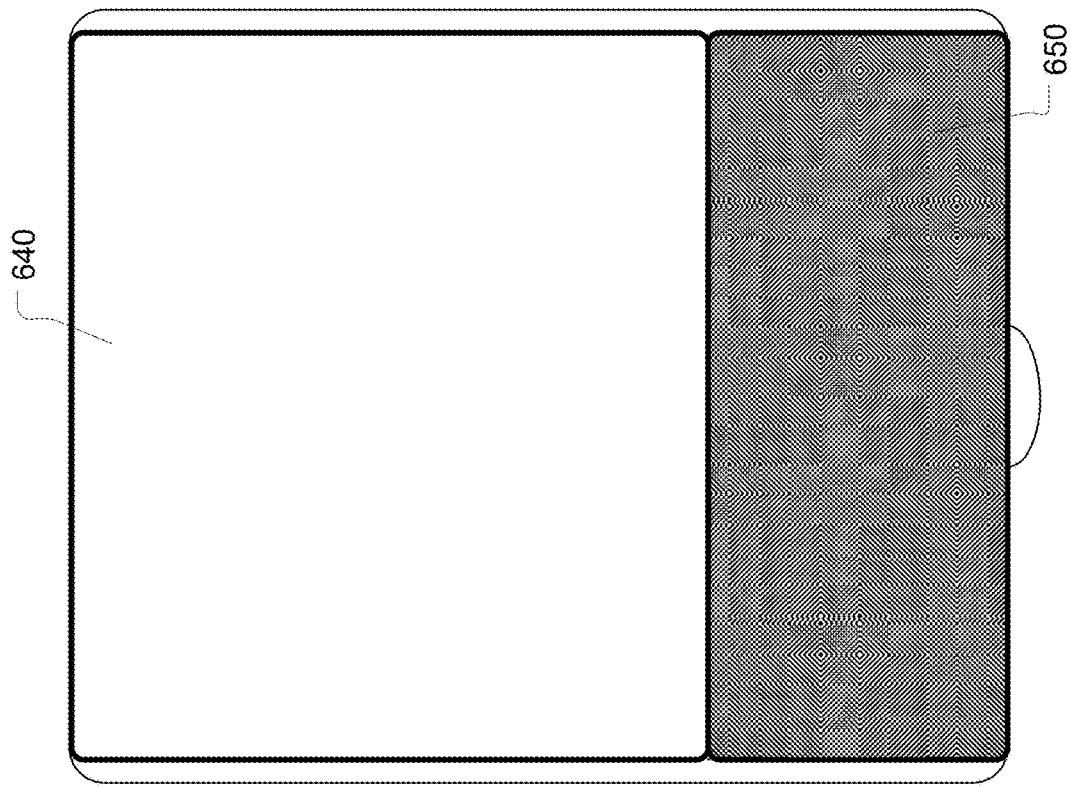
FIG. 31 depicts another example of a window divided into two discrete transparent shadeable touchscreen displays.
Figure 30:
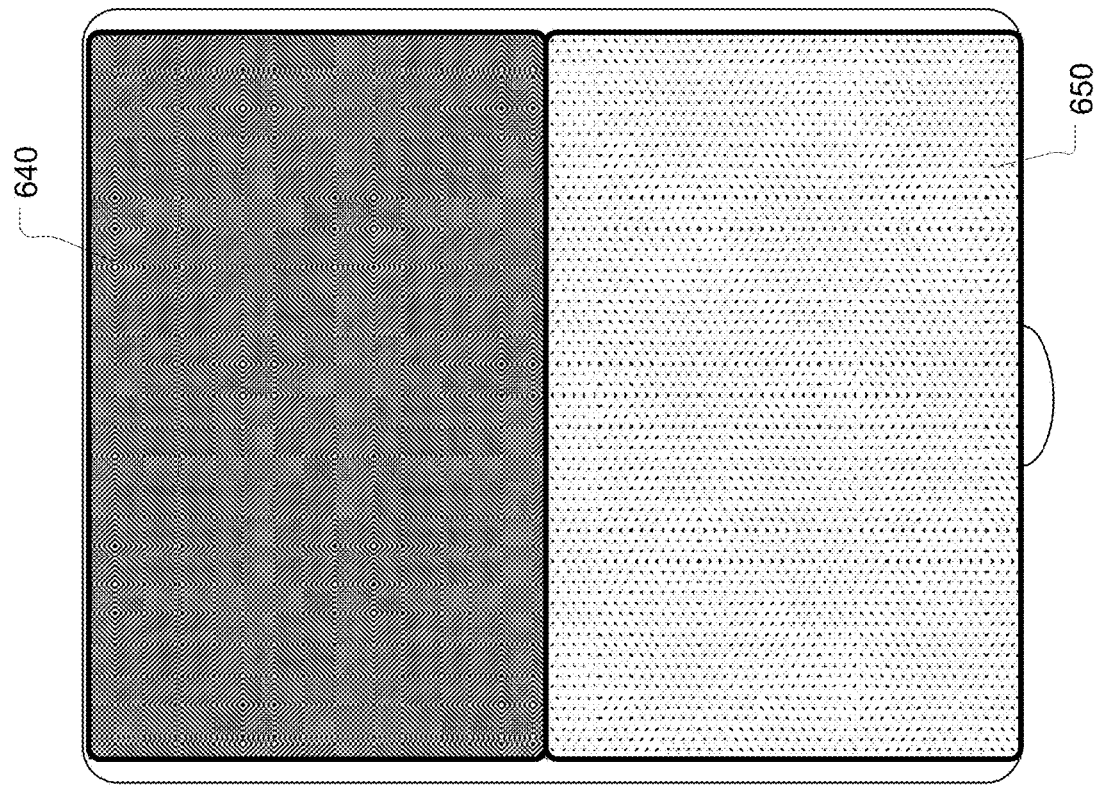
FIG. 30 depicts an example of a window divided into two discrete transparent shadeable touchscreen displays.

In the embodiments depicted by way of example in FIGS. 30-31, the transparent tablet-like sun shade may be divisible into a plurality of discrete regions or portions, e.g. an upper portion 640 and a lower portion 650. In another embodiment, each may be a separate and discrete tablet. The relative sizes may be varied as shown in these figures. These may be separate slidable tablet-like shades or these may be screens integrated into the windows.

Figure 33:
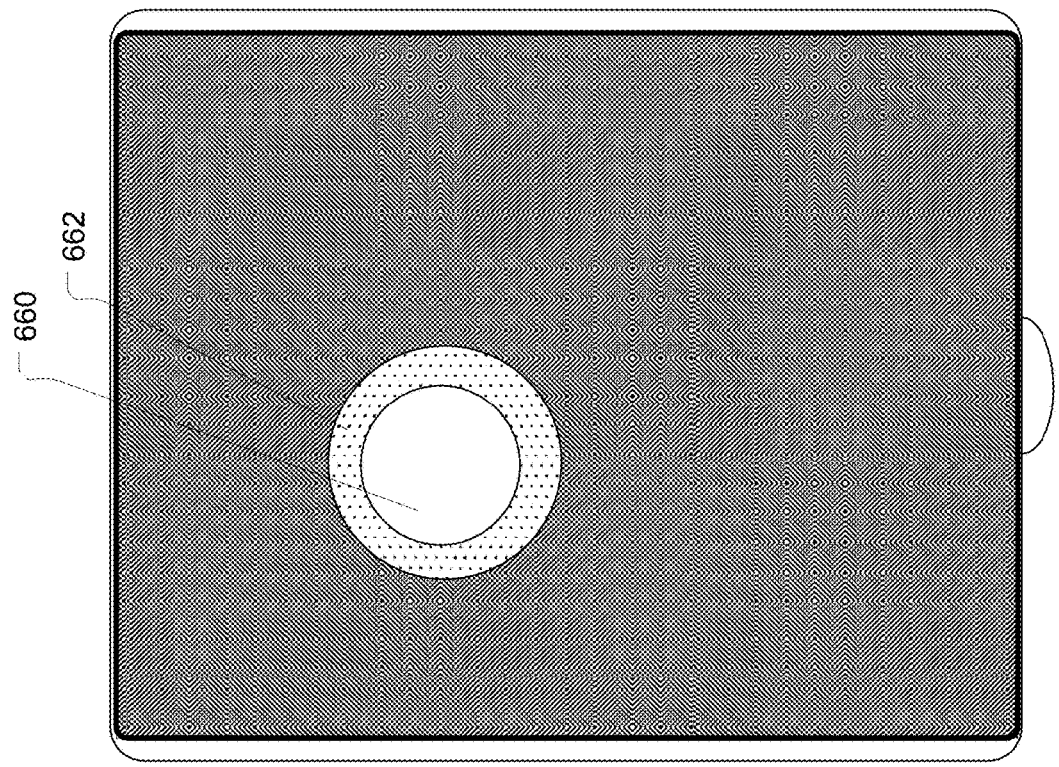
FIG. 33 depicts a tablet-like sun shade with a virtual peephole having concentric regions of differential shading.
Figure 32:
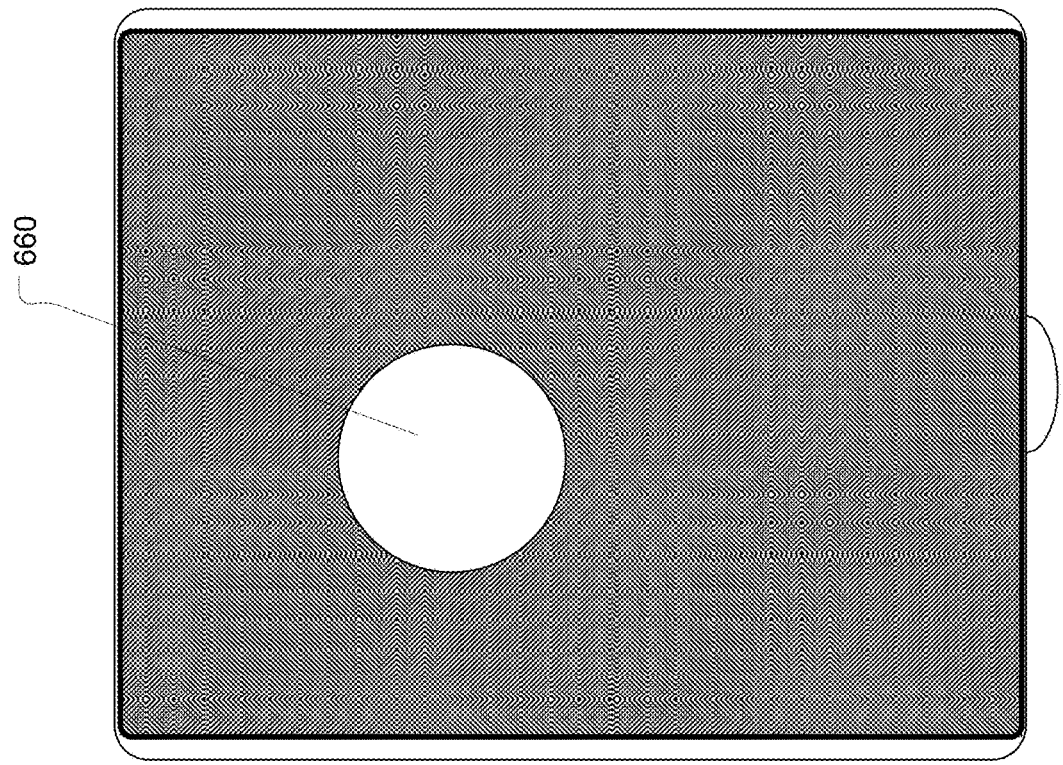
FIG. 32 depicts a tablet-like sun shade with a virtual peephole.

In the embodiments depicted by way of example in FIGS. 32-33, the tablet may be darkened, i.e. shaded but a virtual peephole 660 provided (by leaving a small region unshaded). This enables the user to look through the window without removing all of the shading. The virtual peephole may have a differentially shaded concentric region 662 of greater or lesser shading.

Figure 34:
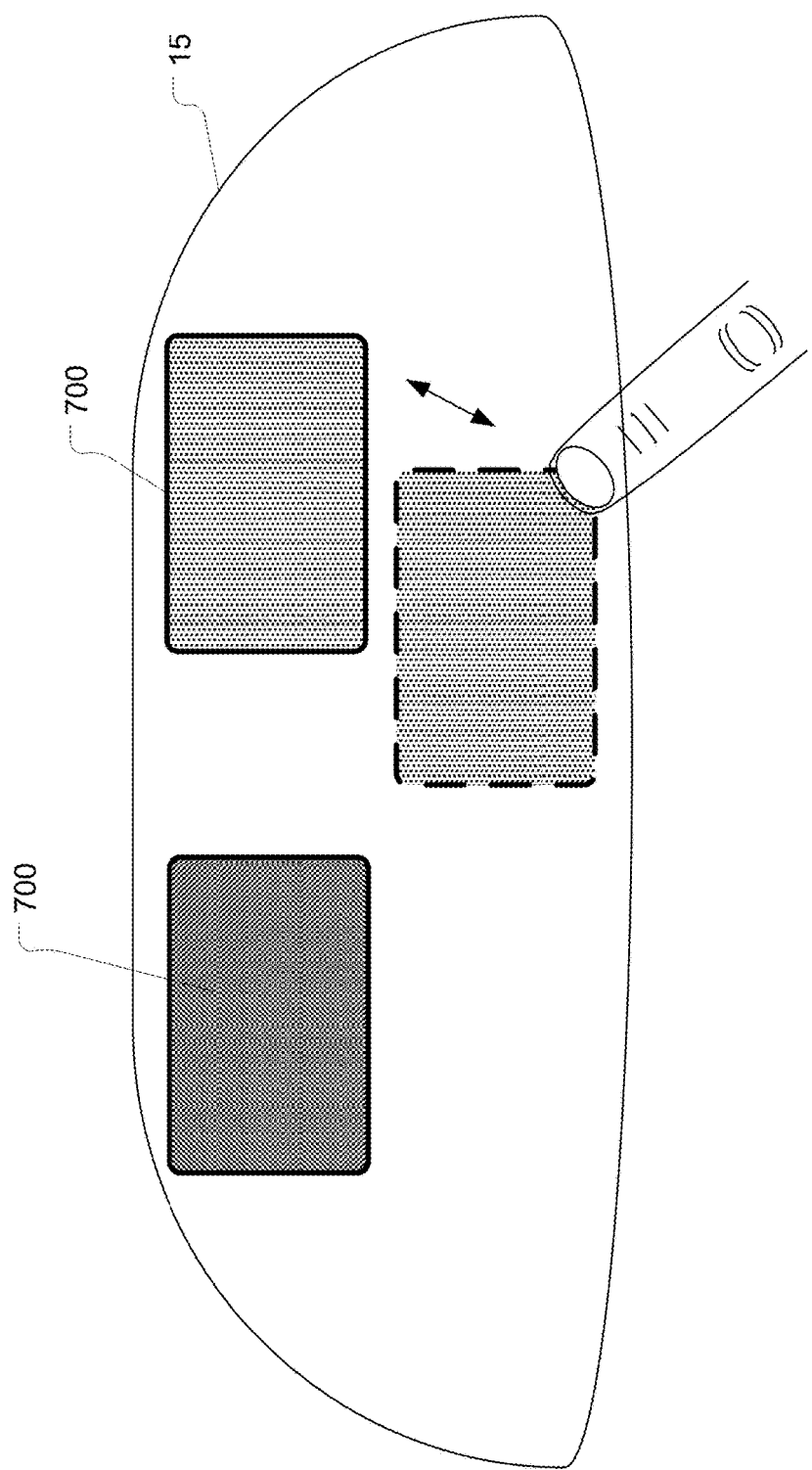
FIG. 34 depicts a transparent touchscreen windshield with two virtual visors that are furthermore movable by touching and dragging the virtual visor on the transparent touchscreen windshield.
Figure 35:
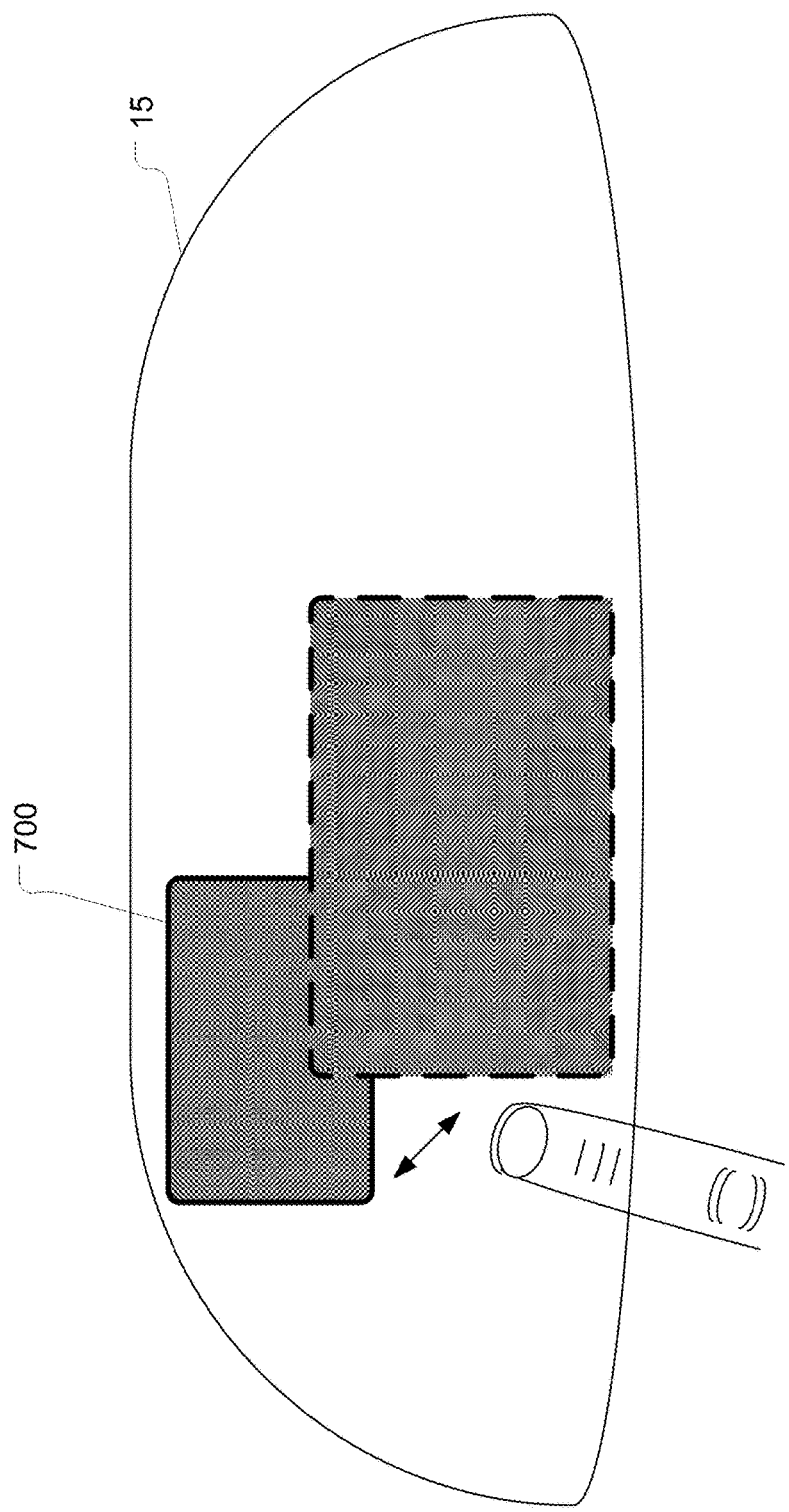
FIG. 35 depicts a virtual visor that may be enlarged by touching and dragging a corner of the virtual visor on the transparent touchscreen windshield.

In the embodiment depicted by way of example in FIG. 34, a touchscreen windshield 15 of an automotive vehicle is made of a transparent OLED or equivalent to provide windshield-embedded transparent touchscreen functionalities. Alternatively, a curved transparent OLED may be affixed as a second pane to a conventional glass windshield. The transparent OLED windshield 15 may have virtual visors 700 that may be displaced automatically (e.g. by tracking the driver's eyesight vector) or in response to user input, e.g. a touch and drag command as shown by example in this figure. In this example, there are both driver and passenger virtual visors 700. Each may be shaded, tinted or colored independently. A sync command may be provided to sync the shading of the two virtual visors. FIG. 35 depicts how the virtual visor 700 may be enlarged, e.g. by manually touching and dragging a corner of the virtual visor.

Figure 36:
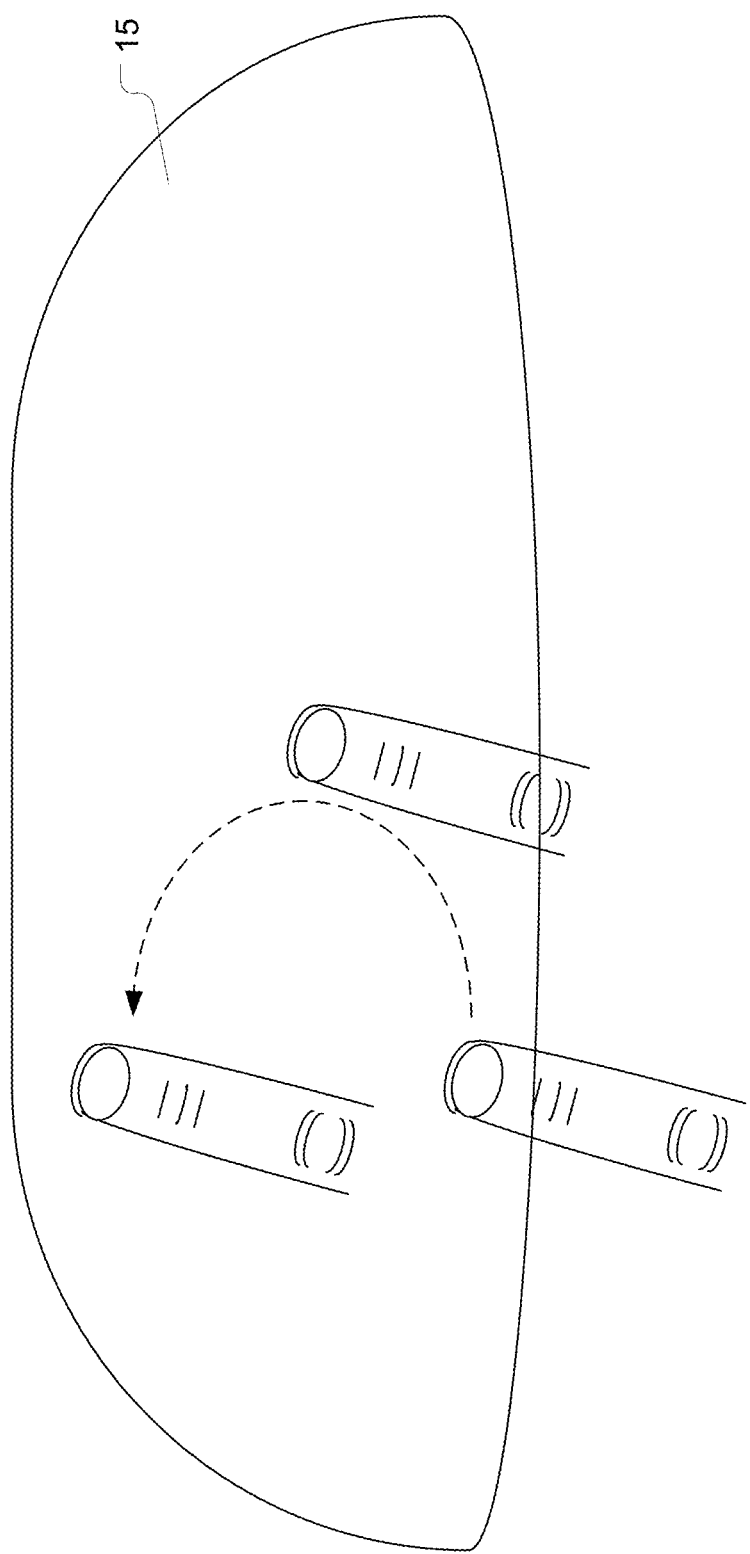
FIG. 36 depicts a user drawing a shape for a virtual visor.
Figure 37:
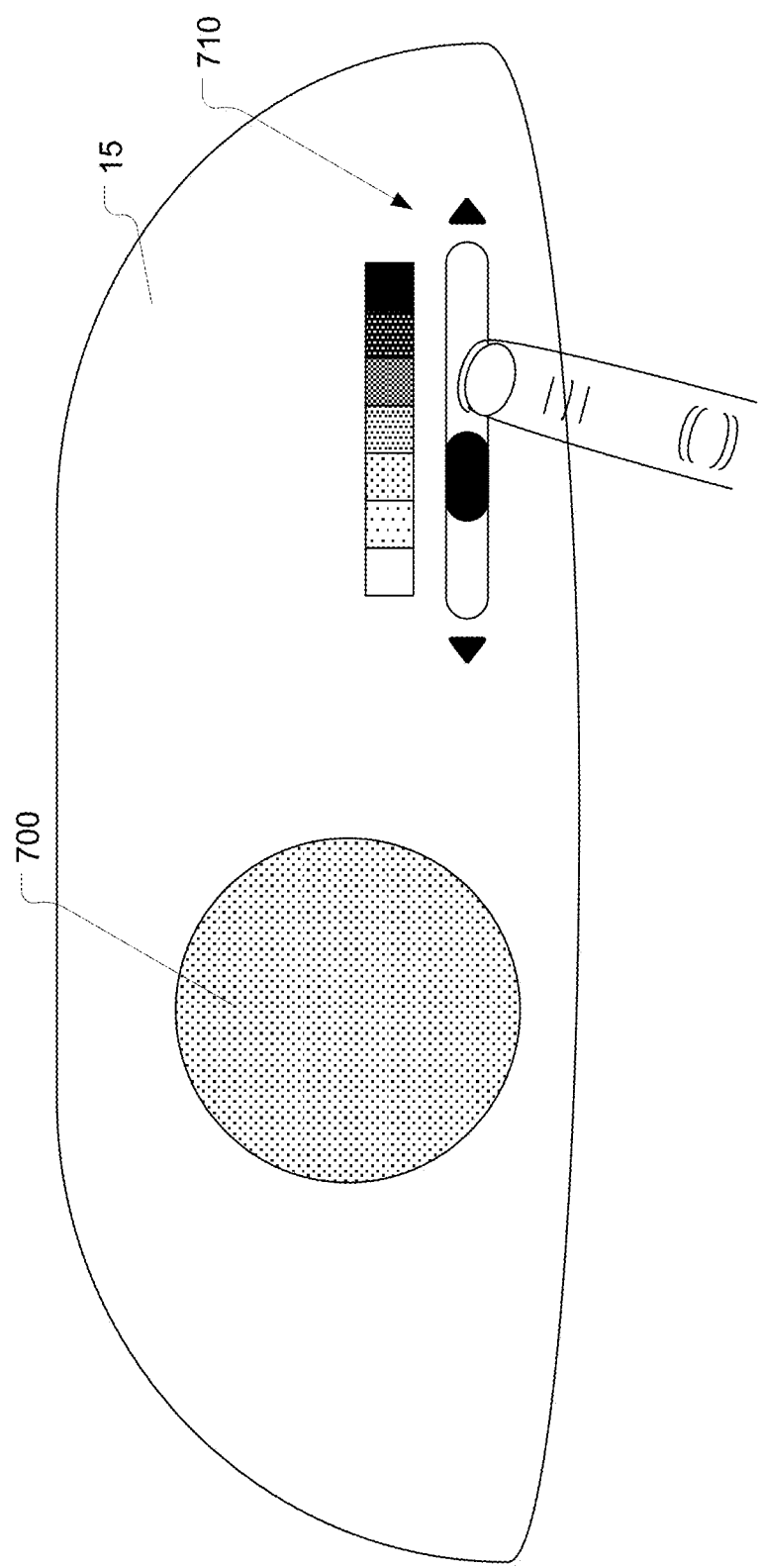
FIG. 37 shows the resulting shape of a virtual visor drawn by the user in FIG. 36.
Figure 38:
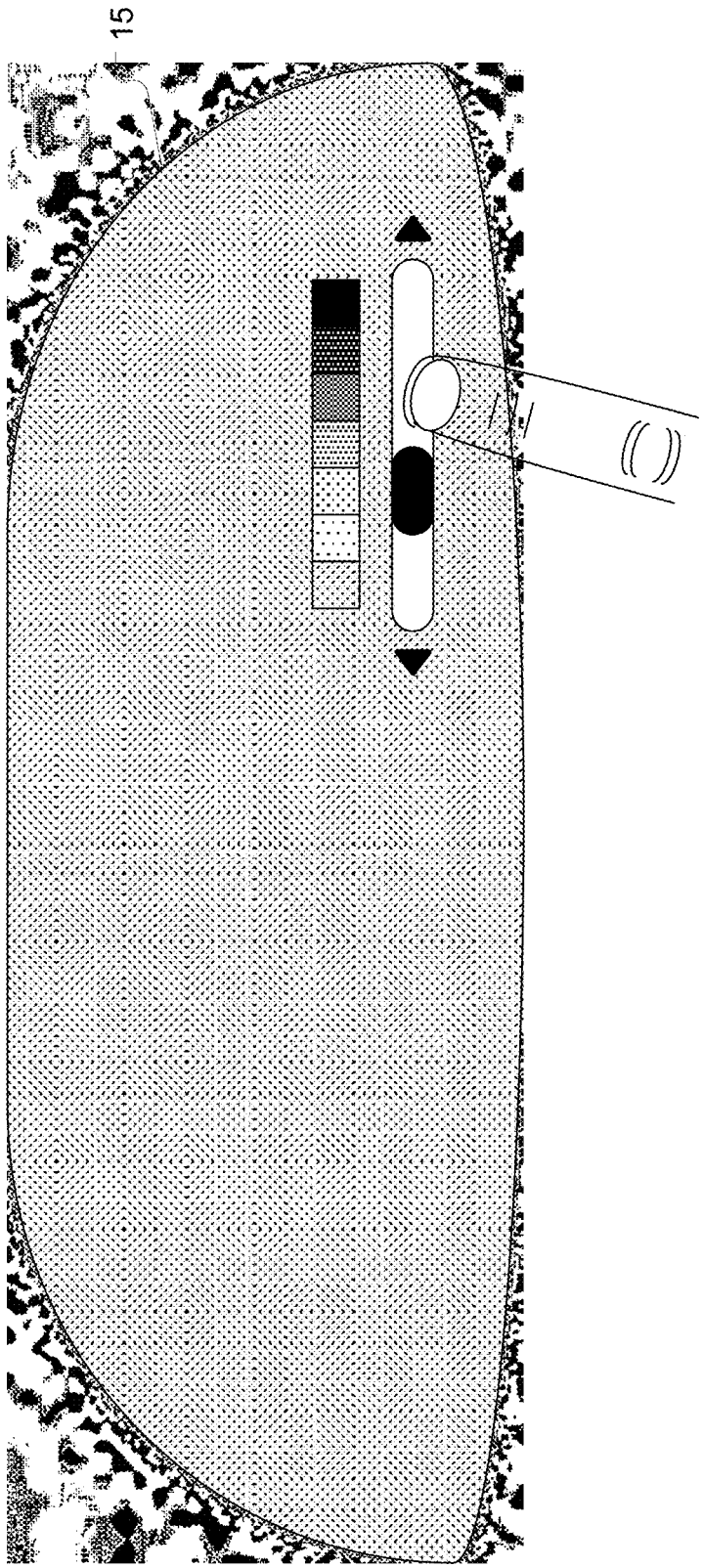
FIG. 38 depicts a slider for manually adjusting the shading of the transparent touchscreen windshield.

FIGS. 36-37 depict how a virtual visor may be manually created by drawing using a finger on the windshield to delineate the size and shape of the desired virtual visor. In this example, the user has drawn a circular shape for the virtual visor. It will be appreciated that any shape could be drawn by the user. The tablet may be configured with a reset or clear screen command to remove any virtual visors. The vehicle may be configured to clear or remove any virtual visors in low-light conditions, e.g. entering a tunnel, switching a drive mode from autonomous to active driving, or when sensing a dangerous or potentially dangerous situation on the road. As further illustrated in FIG. 37, the touchscreen windshield may displayed a virtual slider 710 enabling a driver, passenger or user to manually adjust the shading of the touchscreen windshield or of any virtual visor displayed on the touchscreen windshield. FIG. 38 shows how the entire touchscreen windshield may be shaded or tinted. FIG. 38 depicts a virtual slider for manually adjusting the degree of shading. In addition, the touchscreen windshield 15 may be configured to display navigational instructions, maps, overlaid augmented reality arrows indicating where to turn, augmented reality signs over roads, landmarks, points of interest, etc. and other indications for navigating. The touchscreen windshield 15 may also display e-mail messages, text messages, alerts, alarms, warnings, etc. The touchscreen windshield 15 may also display vehicle and/or dashboard information as a virtual heads-up display. The touchscreen windshield may present any one or more of a speedometer, odometer, fuel gauge for a car having an internal combustion engine, a battery charge status for an electric vehicle or a hybrid electric vehicle, etc.

Figure 39:
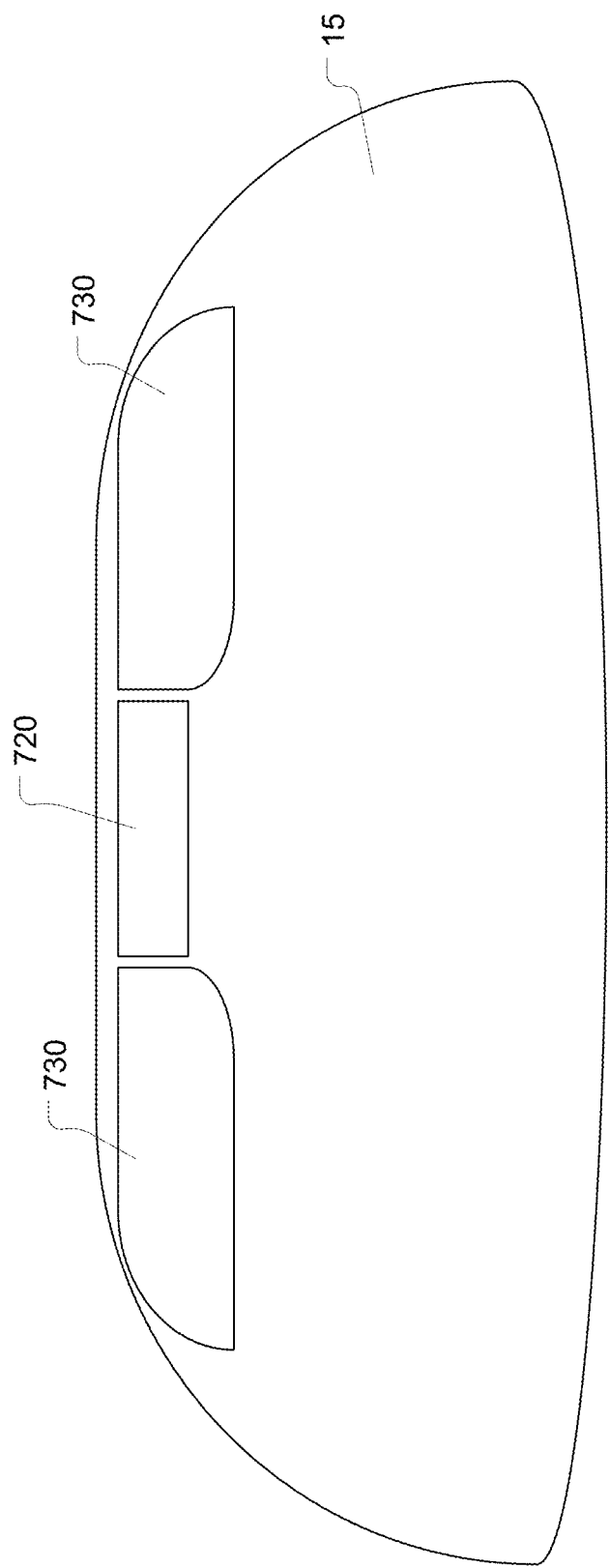
FIG. 39 depicts a transparent touchscreen windshield having a virtual rearview mirror and two virtual visors.

In the embodiment depicted by way of example in FIG. 39, the touchscreen windshield 15 includes a virtual rearview mirror 720 comprising a video camera image (optionally mirror-inverted for greater realism) from a live video feed of a digital video camera mounted in a rearwardly facing direction on the vehicle, e.g. a backup camera. The touchscreen windshield 15 also includes virtual visors 730 that can be dynamically shaded to attenuate or block intense incoming light such as sunlight or headlights of oncoming vehicles. The virtual rearview mirror 720 and the virtual visors 730 can be controlled by a processor or controller in the vehicle in response to user input or user commands and/or in response to sensor signals automatically generated and processed by the processor or controller. For example, the virtual visors may be activated in response to detecting an intense incoming light coming from, for instance, the sun or headlights of oncoming vehicles. The degree of shading of the virtual visors may be preset and/or user-adjustable, e.g. by adjusting one or more user input devices on the dashboard or central console of the vehicle.

In one variant, the virtual rearview mirror automatically activates and deactivates based on activation and deactivation signals generated by an eye-tracking sensor that detects an eyesight direction (or vision vector) of a driver. If the eye-tracking sensor detects that the driver is looking toward the predetermined location of the virtual rearview mirror, i.e. the upper central portion of the front windshield, then the virtual rearview mirror is activated, i.e. turned on to show the rear camera image to the driver. If the eye-tracking sensor detects that the driver is looking elsewhere, i.e. not at the location of the virtual rearview mirror, then the virtual rearview mirror is deactivated. Thus, the transparent shadeable touchscreen windshield can switch rapidly between a purely transparent windshield and one that displays the virtual rearview mirror. In addition, the virtual visors can be deactivated or activated either automatically or manually (based on user input). When activated, the degree of shading or tinting of each of the virtual visors can be dynamically varied in response to light conditions or user input.

In another variant, the virtual rearview mirror may include a virtual frame to visually distinguish the virtual rearview mirror from the rest of the windshield and to thus make the virtual rearview mirror appear somewhat like a conventional mirror to the driver.

Figure 40:
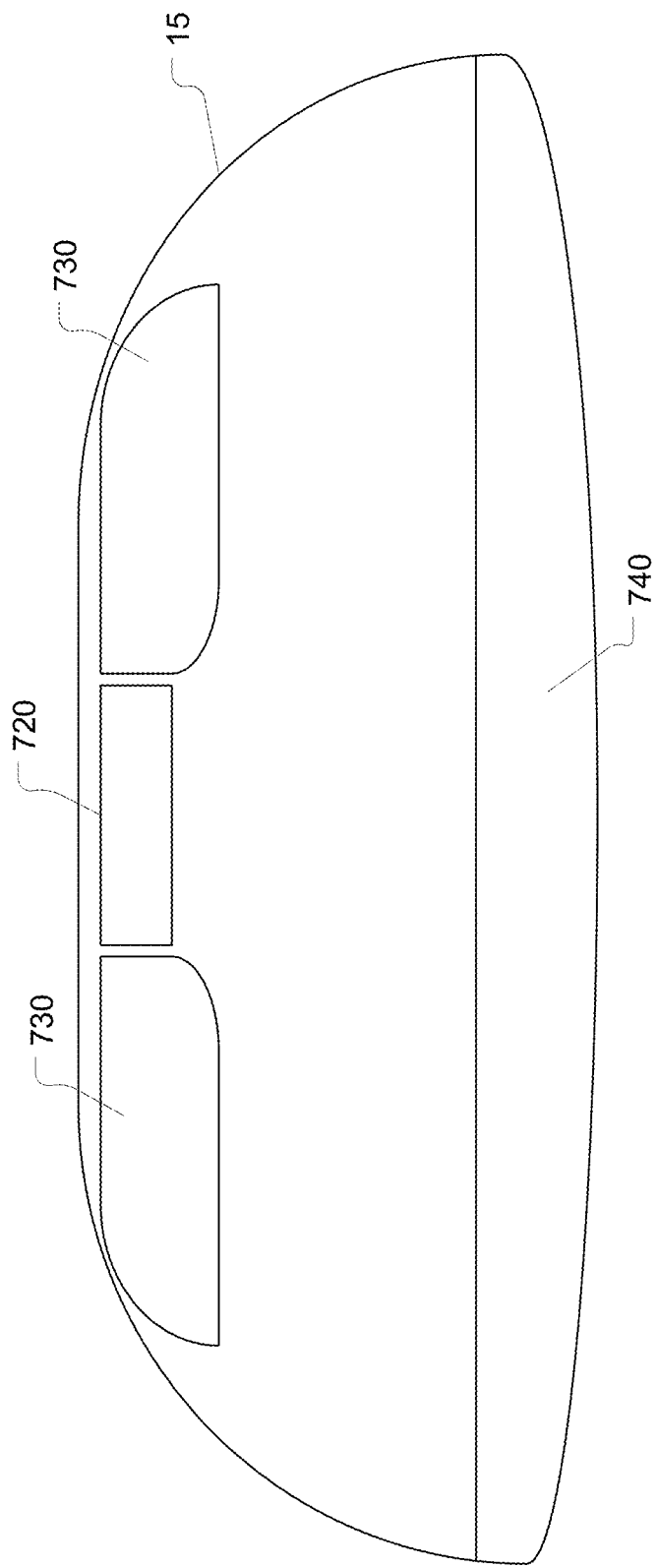
FIG. 40 depicts a transparent touchscreen windshield having a virtual rearview mirror, two virtual visors and a lower band visor.

In the embodiment depicted by way of example in FIG. 40, the touchscreen windshield 15 further includes a lower region 740 that functions as a lower visor or band to attenuate or block sunlight hitting the driver's eyes from a lower angle.

Figure 42:
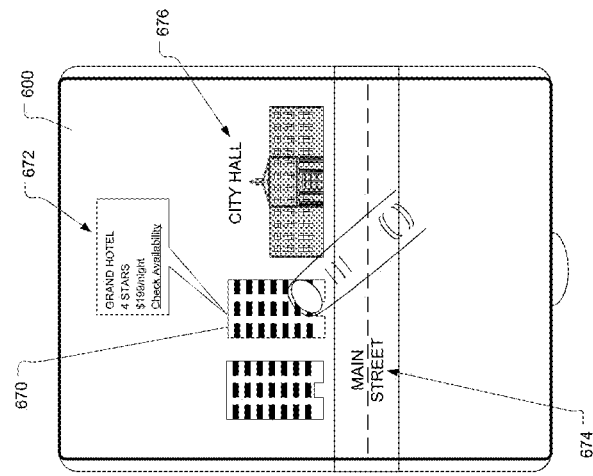
FIG. 42 depicts the same bus window with the tablet-like sun shade lowered into the deployed position and further displaying an augmented reality view through the tablet-like sun shade.
Figure 41:
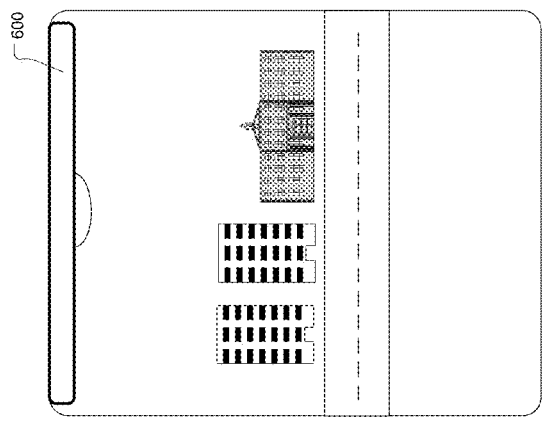
FIG. 41 depicts a bus window equipped with a tablet-like sun shade raised into the stowed position.

FIG. 41 and FIG. 42 depict transparent and shadeable tablet-like sun shades 600 used as dynamically shadeable visors or shades in a window of a vehicle such as a bus, for example a tour bus. FIG. 41 shows the tablet-like sun shade 600 stowed (raised) such that the passenger, tourist or user can look out of the window without looking through the sunshade. For the sake of illustration, and solely by way of example, FIG. 41 depicts a street and three buildings. FIG. 42 shows the tablet-like sun shade 600 deployed (lowered) such that the passenger, tourist or user can look out of the window through the transparent, or partially transparent (i.e. shaded), sun shade or visor. As shown by way of example in FIG. 42, a user may touch a location onscreen that correlates to a building 670 to thereby cause the tablet to display further information about the building, e.g. in a pop-up window, text bubble 672 or other such visual means. The text bubble 672 may include a hyperlink to obtain web-based content regarding the place in question, in this case the Grand Hotel. The tablet-like sun shade 600 may label or annotate items to provide an augmented reality view. For example, the tablet-like sun shade 600 may label or annotate the street 674 (e.g. "Main Street") and the building on the right 676 ("City Hall"). Information for the augmented reality view may be obtained by the tablet via a cellular data connection or any other data communication channel available to the tablet-like sun shade 600.

Figure 44:
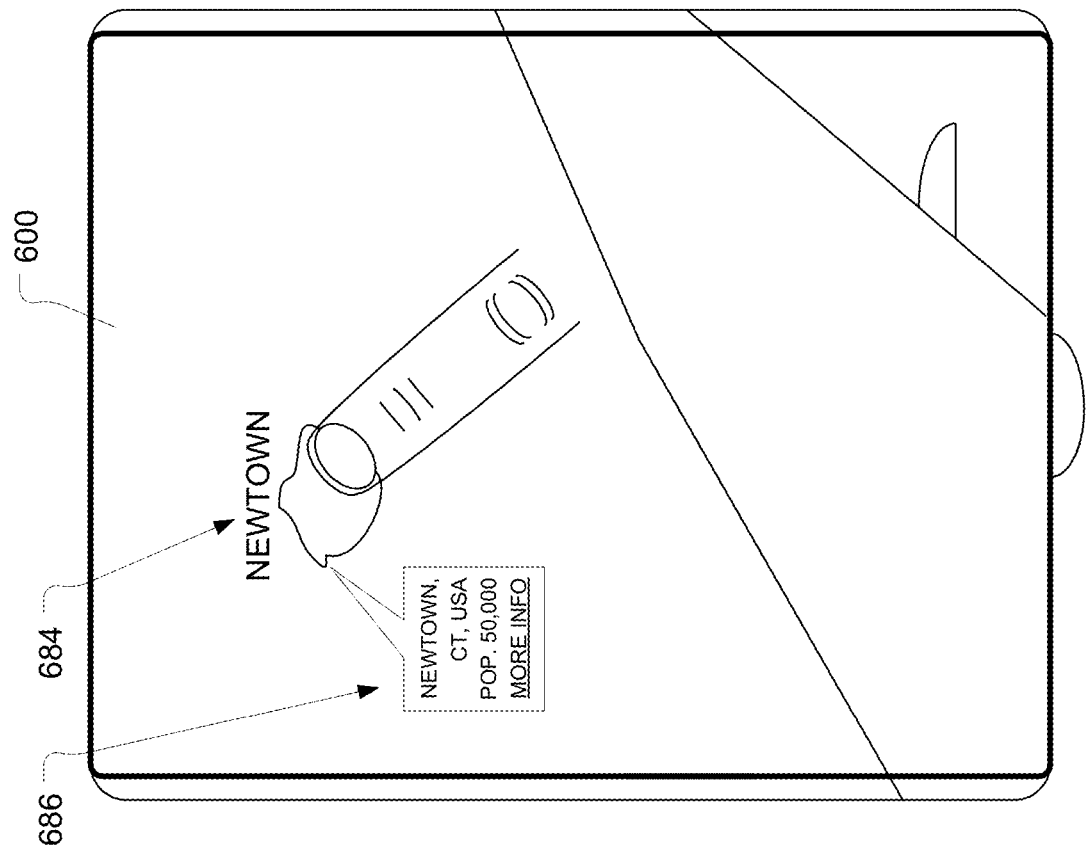
FIG. 44 depicts the same airplane window with the tablet-like sun shade lowered into the deployed position and further displaying an augmented reality view through the tablet-like sun shade.
Figure 43:
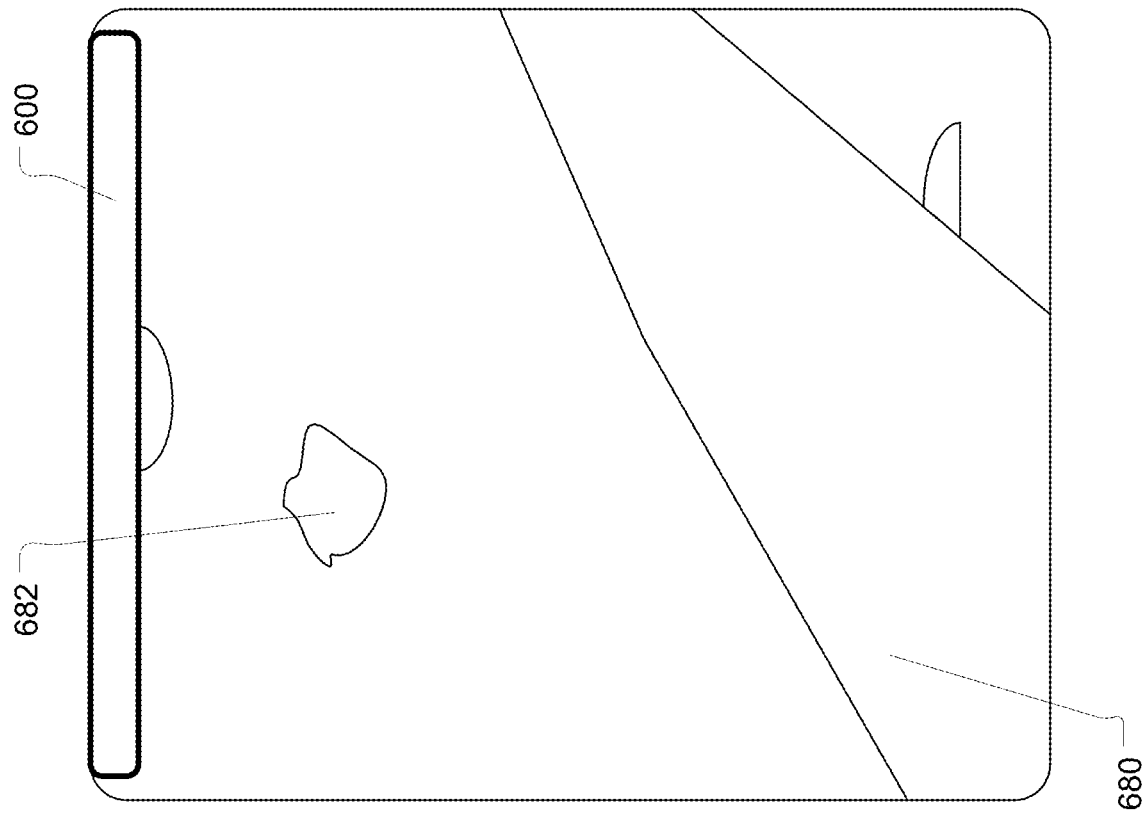
FIG. 43 depicts an airplane window equipped with a tablet-like sun shade raised into the stowed position.

FIGS. 43-44 illustrate a tablet-like sun shade 600 for use in an aircraft porthole-type window of the type commonly found on commercial airliners. In this example, FIG. 43 shows a view through the window with the tablet-like sun shade 600 stowed (i.e. retracted or raised). Through the window, the passenger can see, in this example, the right-side wing 680 of the aircraft and a distant outline of a city 682.

In the example depicted in FIG. 44, the tablet-like sun shade 600 is lowered, i.e. deployed. Through the tablet-like sun shade 600 the passenger can see the wing and the city, as before, but in addition, the tablet-like sun shade 600 provides an augmented reality view by labelling or annotating the city with an onscreen augmented reality label 684 (e.g. "Newtown"). The augmented reality label 684 is furthermore responsive to user input in the form of touch input. If the user touches the label a further text bubble 686 or text box is generated and displayed. The label may be generated by the tablet or by another computer communicatively connected to the tablet, including one in the vehicle. The text bubble 686 may include information about the city and may include one or more hyperlinks to one or more websites.

It will be appreciated that, for the purposes of this specification, the term "shading" includes tinting or coloring, hatching, cross-hatching, dotting, or patterning the display to reduce or attenuate the incoming light traversing the transparent display.

In yet another embodiment, an automotive vehicle may have all of its windows or windshields made of a transparent and shadeable touchscreen such that the front, rear and side windows or windshields can each be individually shaded either manually or automatically. In a further variant, the vehicle may be configured to automatically darken or shade all windows or windshields of the vehicle when the vehicle is parked and/or locked to protect the privacy of those inside the vehicle and/or the interior of the vehicle and/or the contents of the vehicle. In another variant, the vehicle may be configured to automatically darken all windows/windshields when driving autonomously with nobody aboard.

Another aspect of the present invention is a method of attenuating incoming light using a transparent and shadeable tablet-like sun shade or visor. The shade or visor may be a separate tablet-like component that is movable into and out of the line of sight. Alternatively, the visor may be virtual visor built into a touchscreen windshield or window. In both instances, the method may be performed either automatically or manually, i.e. in response to user input. In an automatic method, the tablet or vehicle senses an intensity of incoming light and dynamically varies the shading of the tablet in response to the intensity of the incoming light. In a manual method, the tablet receives user input and dynamically varies the shading of the tablet in response to the user input. In a hybrid method, the tablet or vehicle measures the intensity of the incoming light and also receives user input and then dynamically varies the shading of the tablet in response to both the intensity of the incoming light and the user input. In another embodiment, a digital camera in the tablet that is communicatively coupled to a processor in the tablet may execute facial recognition software to determine user preferences based on who is driving and thus adjust the shading to usual shading parameters that have historically been selected by the particular driver. In another embodiment, the camera and processor of the tablet cooperate to recognize whether the driver is wearing sunglasses or not and adjusts the shading based on whether the driver is wearing sunglasses or not.

The foregoing methods can be implemented in hardware, software, firmware or as any suitable combination thereof. That is, if implemented as software, the computer-readable medium comprises instructions in code which when loaded into memory and executed on a processor of a tablet or mobile device causes the tablet or mobile device to perform any of the foregoing method steps.

These method steps may be implemented as software, i.e. as coded instructions stored on a computer readable medium which performs the foregoing steps when the computer readable medium is loaded into memory and executed by the microprocessor of the mobile device. A computer readable medium can be any means that contain, store, communicate, propagate or transport the program for use by or in connection with the instruction execution system, apparatus or device. The computer-readable medium may be electronic, magnetic, optical, electromagnetic, infrared or any semiconductor system or device. For example, computer executable code to perform the methods disclosed herein may be tangibly recorded on a computer-readable medium including, but not limited to, a floppy-disk, a CD-ROM, a DVD, RAM, ROM, EPROM, Flash Memory or any suitable memory card, etc. The method may also be implemented in hardware. A hardware implementation might employ discrete logic circuits having logic gates for implementing logic functions on data signals, an application-specific integrated circuit (ASIC) having appropriate combinational logic gates, a programmable gate array (PGA), a field programmable gate array (FPGA), etc.

For the purposes of interpreting this specification, when referring to elements of various embodiments of the present invention, the articles "a", "an", "the" and "said" are intended to mean that there are one or more of the elements. The terms "comprising", "including" and "having" are intended to be inclusive and open-ended by which it is meant that there may be additional elements other than the listed elements.

This new technology has been described in terms of specific implementations and configurations which are intended to be exemplary only. Persons of ordinary skill in the art will appreciate that many obvious variations, refinements and modifications may be made without departing from the inventive concepts presented in this application. The scope of the exclusive right sought by the Applicant(s) is therefore intended to be limited solely by the appended claims.

The invention claimed is:

1. An automotive vehicle comprising:
a cabin having a windshield; and
a holder pivotally connected to an interior surface of the cabin for holding a tablet or a mobile device, the holder being pivotable between a stowed position and a deployed position, wherein the holder comprises a combined power and data port for connecting to a combined power and data socket of the tablet or the mobile device to both supply power from the vehicle to recharge a battery of the tablet or the mobile device and to communicate data from the vehicle to the tablet or the mobile device;
wherein the tablet or the mobile device is detachably mounted to the holder such that the tablet functions as a visor when detachably mounted to the holder,
wherein the combined power and data port is rotatable relative to the holder such that the tablet or the mobile device is receivable in a reversed position by the holder to enable the tablet or the mobile device to display information through the windshield of the vehicle to be visible from outside the vehicle.

2. The automotive vehicle as claimed in claim 1 wherein the tablet is a transparent tablet comprising a transparent OLED touch-sensitive display screen.

3. The automotive vehicle as claimed in claim 2 further comprising an eye-tracking sensor for determining a vision vector representing a direction of vision of a driver and for using the vision vector to block or attenuate incoming light above a predetermined light intensity threshold.

4. The automotive vehicle as claimed in claim 3 further comprising a light sensor that provides a light intensity signal to the tablet to enable the tablet to dynamically adjust a shading of a display screen.

5. The automotive vehicle as claimed in claim 4 wherein the tablet is configured to differentially shade the display screen so that a first area of the display screen is shaded more than a second area of the display screen.

6. The automotive vehicle as claimed in claim 2 further comprising a FLIR or thermal imaging camera to capture night-vision images to synthetically enhance a view through the screen.

7. The automotive vehicle as claimed in claim 2 wherein a processor of tablet is configured to overlay navigational labels to create an augmented reality view.

8. The automotive vehicle as claimed in claim 1 comprising a servo to automatically deploy or stow the tablet or the mobile device in response to a trigger condition determined by the processor.

9. The automotive vehicle of claim 1 wherein the holder comprises a support bracket that includes a horizontal member upon which the tablet or the mobile device is supported and an orthogonal member connected orthogonally to the horizontal member, wherein the combined power and data port is disposed on the orthogonal member.

10. A holder for an automotive vehicle, the holder comprising:

a support bracket defining a docking station to detachably hold a tablet or a mobile device in a landscape orientation inside a cabin of the automotive vehicle, wherein the tablet functions as a visor of the automotive vehicle and wherein the support bracket comprises a horizontal member upon which the tablet or the mobile device is supported and an orthogonal member connected orthogonally to the horizontal member, wherein the orthogonal member comprises a combined power and data port for connecting to a combined power and data socket of the tablet or the mobile device, wherein the support bracket comprises grooves to slidably receive the tablet or mobile device such that the tablet or the mobile device is slid horizontally into engagement with the support bracket until the combined power and data socket of the tablet or the mobile device connects to the combined power and data port on the orthogonal member, wherein the grooves have adjustable width to accommodate different thicknesses of tablets or mobile devices; and a pivot to rotate the support bracket and the tablet or the mobile device between a stowed position and a deployed position.

11. The holder of claim 10 wherein the support bracket comprises a horizontally translating mechanism to translate the tablet or the mobile device horizontally while the combined power and data port is connected to the combined power and data socket and an orthogonally translating mechanism to translate the tablet or the mobile device orthogonally while the combined power and data port is connected to the combined power and data socket.

12. The holder of claim 10 wherein the combined power and data port is rotatable relative to the holder such that the tablet or the mobile device is receivable in a reversed position by the holder to enable the tablet or the mobile device to display information through a windshield of the automotive vehicle to be visible from outside the automotive vehicle.

13. The holder of claim 10 wherein the horizontal member defines a first horizontal member, wherein the support bracket further comprises a second horizontal member parallel to the first horizontal member, and wherein both the first and second horizontal members are connected to the orthogonal member.

14. The holder of claim 10 wherein the holder is an adjustable holder in which the support bracket has adjustable horizontal bracket members that move orthogonally to change a spacing between the horizontal bracket members.

15. An automotive vehicle having a tablet or mobile device detachably held inside a cabin of the automotive vehicle, the automotive vehicle comprising:

a holder pivotally mounted inside the cabin of the automotive vehicle and having a combined power and data port, the holder holding the tablet or the mobile device;

wherein the tablet or the mobile device comprises a combined power and data socket to receive power and data from the combined power and data port of the holder;

wherein the tablet or the mobile device has a transparent display screen and a processor configured to cause the display screen to partially shade a discrete portion of the display screen to attenuate intense incoming light; and wherein the tablet or the mobile device comprises a digital camera that is communicatively coupled to the processor to execute facial recognition software to identify a driver and to adjust a shading of the discrete portion of the display screen based on an identity of the driver.

16. The automotive vehicle of claim 15 comprising a servo connected to the holder to automatically deploy or stow the tablet or the mobile device in response to a trigger condition determined by the processor.

17. The automotive vehicle as claimed in claim 15 comprising solar cells on a rear surface of the tablet or mobile device to collect solar energy to recharge the tablet or mobile device when deployed such that the rear surface of the tablet or mobile device is exposed to solar radiation through a windshield of the automotive vehicle.

18. The automotive vehicle of claim 15 wherein the holder is controlled by a controller that automatically repositions the holder based on a sensed condition, wherein the sensed condition is one of eyesight direction, detected driver position, incoming light and user settings.

19. The automotive vehicle of claim 15 wherein the processor cooperates with the camera to determine whether the driver is wearing sunglasses and wherein the processor cooperates with the display screen to change the shading of the display screen based on whether the driver is wearing sunglasses.

* * * * *